United States Patent [19]
Hosoya

[11] Patent Number: 5,757,232
[45] Date of Patent: May 26, 1998

[54] HIGH-IMPEDANCE CIRCUIT HAVING REDUCED STRAY CAPACITANCE

[75] Inventor: Nobukazu Hosoya, Nara, Japan

[73] Assignee: Sanyo Electric Co., Osaka, Japan

[21] Appl. No.: 669,843

[22] Filed: Jun. 26, 1996

Related U.S. Application Data

[63] Continuation of Ser. No. 229,611, Apr. 19, 1994, abandoned.

[30] Foreign Application Priority Data

Apr. 19, 1993 [JP] Japan ................................. 5-091260

[51] Int. Cl.$^6$ ................................................. H03F 3/45
[52] U.S. Cl. ................................. 330/252; 330/260
[58] Field of Search ................................. 330/252, 257, 330/260, 292; 348/707

[56] References Cited

U.S. PATENT DOCUMENTS

| | | | |
|---|---|---|---|
| 3,996,609 | 12/1976 | Avery | 348/707 X |
| 4,380,739 | 4/1983 | Velo | 330/257 X |
| 4,513,242 | 4/1985 | Yokogawa | 323/352 |
| 5,012,201 | 4/1991 | Morita et al. | 330/252 |
| 5,157,322 | 10/1992 | Llewellyn | 330/257 X |
| 5,266,852 | 11/1993 | Shigenari et al. | 330/257 X |
| 5,381,106 | 1/1995 | Limberg | 330/260 X |

FOREIGN PATENT DOCUMENTS

| | | |
|---|---|---|
| 0 186 401 | 7/1986 | European Pat. Off. . |
| 1 573 616 | 8/1980 | United Kingdom . |

OTHER PUBLICATIONS

Patent Abstract of Japan, vol. 8, No. 29 (E-226) dated Feb. 7, 1984, titled Sound Multiplex Signal Receiver (of JP 58 191578, published Nov. 8, 1983).

Patent Abstract of Japan, vol. 9, No. 234 (E-344) dated Sep. 20, 1985, titled Floating High Impedance Circuit (of JP 60 089117, published May 20, 1985).

European Search Report dated Nov. 6, 1995, Ref No. cv-FP-0604 citing above listed references.

*Primary Examiner*—Steven J. Mottola
*Attorney, Agent, or Firm*—Armstrong, Westerman, Hattori, McLeland & Naughton

[57] ABSTRACT

A high-impedance circuit includes a differential pair circuit composed of a first transistor and a second transistor, and a buffer circuit. The buffer circuit includes an NPN type transistor pair composed of a cascade connection of NPN type transistors and a PNP type transistor pair composed of a cascade connection of PNP type transistors, and bases of the NPN type transistors and bases of PNP type transistors respectively corresponding to the NPN type transistors are connected to each other, respectively so as to constitute current mirror circuits. An output of the differential pair circuit is connected to a cascade connection point of the NPN type transistor pair, and an emitter of an NPN type transistor included in the NPN type transistor pair is connected to the ground via a constant current source, and the emitter is connected to bases of the first transistor and the second transistor via resistors, respectively. Therefore, the output of the differential pair circuit is fed-back to inputs of the differential pair circuit, i.e. the bases of the first transistor and the second transistor as base currents.

22 Claims, 11 Drawing Sheets

F I G. 1
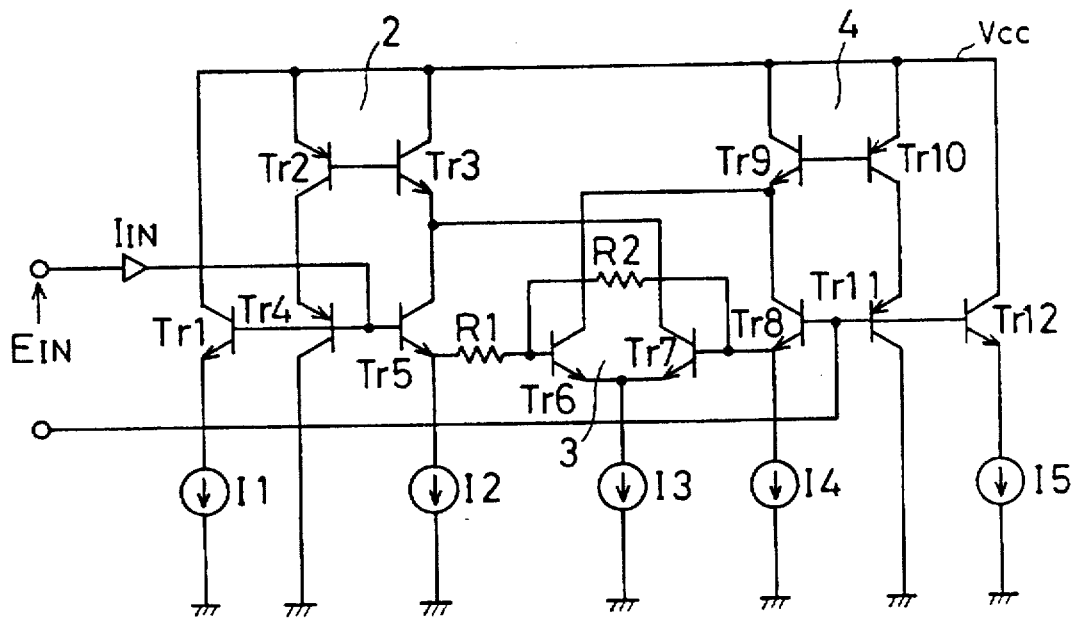
F I G. 2
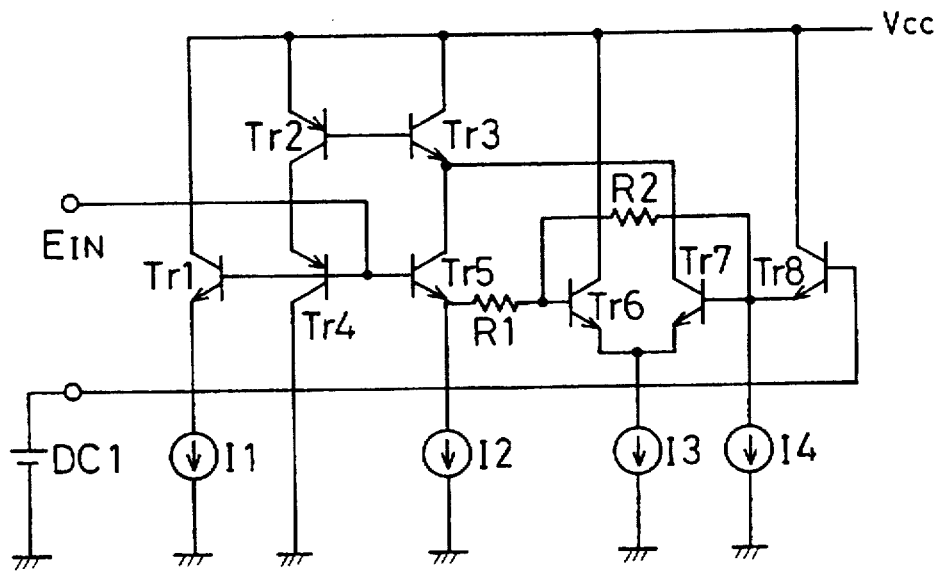

F I G.14
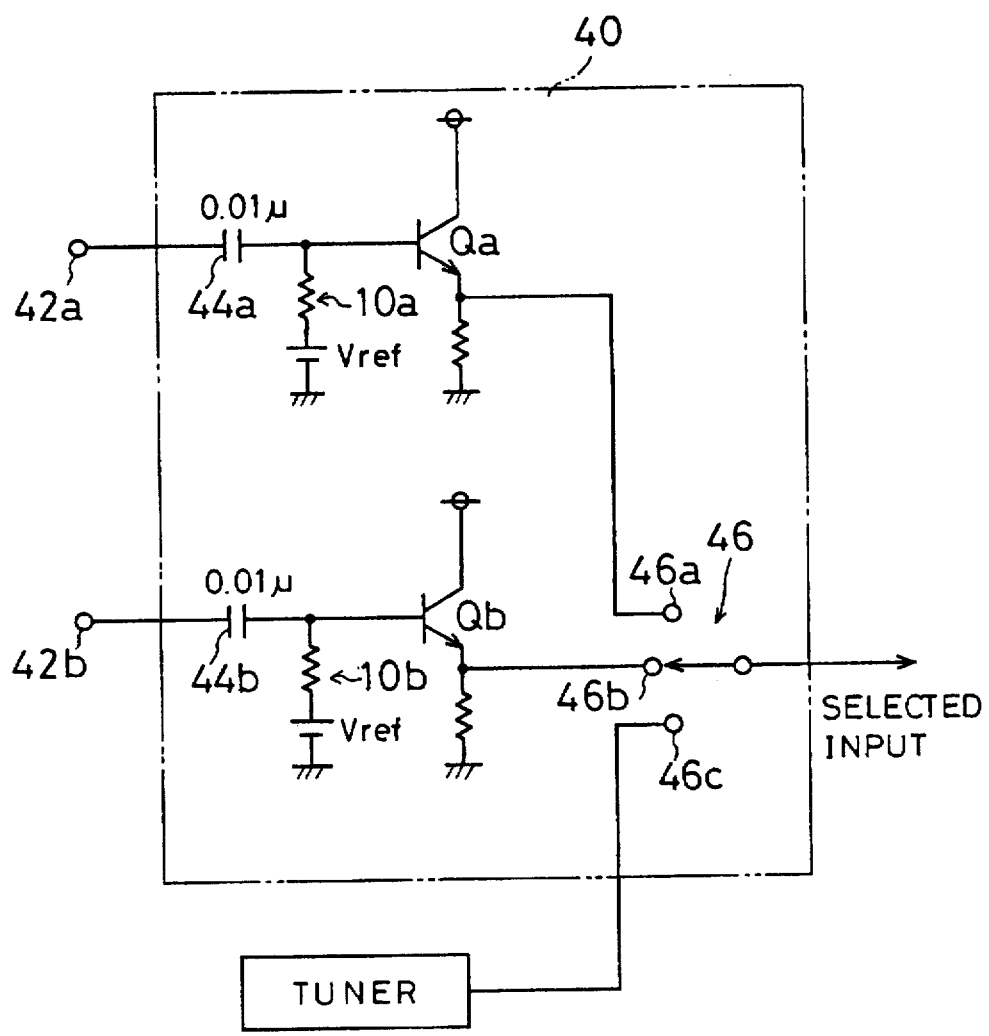

HIGH-IMPEDANCE CIRCUIT HAVING REDUCED STRAY CAPACITANCE

This application is a continuation of application Ser. No. 08/229,611 filed Apr. 19, 1994, now abandoned.

BACKGROUND OF THE INVENTION

1. Field of the invention

The present invention generally relates to a high-impedance circuit. More specifically, the present invention relates to a high-impedance circuit having incorporated in an integrated circuit.

2. Description of the prior art

FIG. 17 is a circuit diagram showing a conventional example, wherein a reference numeral 1 denotes a high-impedance circuit which is constructed by transistors and resistors. In the high-impedance circuit 1, an equivalent resistor R between bases of transistors T1 and T2 can be evaluated in the following manner.

At first, it is assumed that a base voltage of the transistor T1 is V1, and a base voltage of the transistor T2 is V2. An emitter voltage of the transistor T1 becomes equal to the base voltage thereof, and therefore, becomes V1 in an alternating current. Similarly, an emitter voltage of the transistor T2 becomes V2.

Then, a voltage VBB1 between bases of a transistor T3 and a transistor T4 which constitutes a differential pair is shown by the following equation (1).

$$VBB1 = V0 \times \frac{R2}{R1+R2+R3} \quad (1)$$

where, V0 is the difference between V1 and V2.

Furthermore, in the same way, a voltage VEE1 between emitters of the transistors T3 and T4 becomes equal to the equation (1), and is represented by the following equation (2).

$$VEE1 = VBB1 \quad (2)$$
$$= V0 \times \frac{R2}{R1+R2+R3}$$

Therefore, since differentiation resistors exist at the sides of the emitters of the transistors T3 and T4 of the differential pair, respectively, a current IE1 flowing in each of the differentiation resistors re can be shown by the following equation (3).

$$IE1 = \frac{VEE1}{(re+re)} \quad (3)$$
$$= V0 \times \frac{R2}{R1+R2+R3} \times \frac{1}{2re}$$

Therefore, the equivalent resistor R between the bases of the transistors T1 and T2 is shown by the following equation (4).

$$R = \frac{V0}{IE1} \quad (4)$$
$$= \frac{R1+R2+R3}{R2} \times 2re$$

Then, if a collector current of a transistor T5 which act as a constant current source is I5, each of the differential resistors re of the transistors T3 and T4 of the differentiation pair can be evaluated according to the following equation (5).

$$re = \frac{52 \, (mV)}{I5} \quad (5)$$

The same assignee has proposed a high-impedance circuit in Japanese Patent Application No. 4-16008 (H01C 13/00) on the basis of such a principle. FIG. 18 is a circuit diagram showing the proposed prior art, wherein a reference numeral 10 denotes a high-impedance circuit which is connected to a signal source 12. An input from the signal source 12 is applied to a point between a buffer circuit 14 which includes a PNP type transistor T7 and NPN type transistors T8 and T9, and a buffer circuit 20 which includes a PNP type transistor T12 and NPN type transistors T13 and T14.

The input through the buffer circuit 14 and the buffer circuit 20 is divided by an impedance dividing circuit 16 which includes resistors R8, R9 and R10. More specifically, outputs of the buffer circuit 14 and the buffer circuit 20 are respectively divided by the resistors R8, R9 and R10 so as to be applied to bases of two NPN type transistors T10 and T11 which have emitters connected to each other to constitute a differential pair.

Then, outputs of the differential pair 18 are respectively negatively fed-back to input sides of the buffer circuits 14 and 20, i.e., bases of the transistors T8 and T13 from collectors of the transistors T10 and T11 via negative feed-back paths 22 and 24. A base of a transistor T22 is controlled by a base current control circuit 28 which includes a PNP type transistor T18, NPN type transistors T19 and T20, a PNP type transistor T21 and an NPN type transistor T22, and a current which is obtained by amplifying the base current supplied from the transistor T21 to the transistor T22 by a current amplification factor β flows in the transistor T22, and therefore, currents each equal to the current flow in a PNP type transistor T15 and an NPN type transistor T23.

Furthermore, the transistor T15 and PNP type transistors T16 and T17 constitute a current mirror circuit, and therefore, currents each equal to the current of the transistor T15 flow in the transistors T16 and T17.

On the other hand, the transistor T23 and an NPN type transistor T24 also constitute a current mirror circuit, and therefore, a current which is obtained by dividing the current flowing in the transistor T23 by a resistance ratio (R12/R13) flows in the transistor T24.

In addition, in order to make a collector current I24 of the transistor T24 be double a collector current of the transistor T23, an area or size of the transistor T24 is set to be double an area or size of the transistor T23. Emitter resistors R11, R12 and R13 are connected between emitters of the transistors T20, T23 and T24 and the ground, respectively. In addition, a ratio of resistors R13 and R12 is so set 1:2 as to obtain the above described current ratio.

In a high-impedance circuit which is thus constructed, the collector current I24 of the transistor T24 is evaluated according to the following equation (6).

$$I24 = \frac{Vcc-3V_{BE}}{R11} \times \frac{1}{\beta n} \times \frac{1}{\beta n} \times \beta p \times \frac{1}{\beta p} \times \beta n \times \frac{R12}{R13} \quad (6)$$
$$= \frac{Vcc-3V_{BE}}{R11} \times \frac{1}{\beta n} \times \frac{R12}{R13}$$
$$= \frac{Vcc-3V_{BE}}{R11} \times \frac{1}{\beta n} \times 2$$

where, β n: a current amplification factor of an NPN type transistor,

β p: a current amplification factor of an PNP type transistor, and

VBE: a voltage between base and emitter of each of the transistors T14, T15 and T16.

In the above described equation (6), $1/\beta_n$ is a current amplification factor of each of the transistors T19 and T20, $\beta_p$ is a current amplification factor of the transistor T18, a $1/\beta_p$ is a current amplification factor of the transistor T21. $\beta_n$ is a current amplification factor of the transistor T22.

On the other hand, an equivalent resistor $R_L$ of the high-impedance circuit 10 can be evaluated according to the following equation (7).

$$R_L = \frac{R8 + R9 + R10}{R9} \times 2 \times \frac{52 \text{ (mv)}}{I24} \qquad (7)$$

$$= \frac{R8 + R9 + R10}{R9} \times \frac{R11}{V_{CC} - V_{BE}} \times \beta_n \times 52 \text{ (mV)}$$

$$V_{CC} = 5 \text{ (V)}, V_{BE} = 0.7 \text{ (V)}, \frac{R8 + R9 + R10}{R9} = 20,$$

$$\beta_n = 200$$

$$R_L = 20 \times \frac{200}{5 - 2.1} \times R11 \times 52 \text{ (mV)}$$

$$= 72 \times R11$$

Therefore, in the high-impedance circuit 10, it is possible to implement an equivalent resistor having a high resistance value, and an area or size for obtaining a resistance value of such a degree does not become large, and therefore, it is possible to obtain an integrated circuit with a low cost.

In addition, by changing the collector current I24 by changing the emitter current of the transistor T20, the resistance value of the equivalent resistor RL can be changed, and therefore, it is possible to implement a high-resistance variable resistor.

However, the differential pair which is a center of the above described structure operates at a base current region, and therefore, there was a problem that a characteristic of the variable resistor is deteriorated in a high frequency region, especially, a distortion or the like is increased due to stray capacitors of the transistors constituting the differential pair.

Furthermore, since the structure wherein collectors which are the outputs of the differential pair are connected to the input end of the signal source is adopted, the stray capacitors of the above described collectors exist between the input end and the ground (zero voltage potential).

SUMMARY OF THE INVENTION

The present invention is for solving the above described problem, and it is an object of the present invention is to provide a high-impedance circuit having high impedance value with simple structure.

The present invention provides a high-impedance circuit characterized in that an output of a differential pair circuit composed of a first transistor and a second transistor is converted into a base current which is fed-back to the differential pair circuit by a buffer circuit.

Further, the present invention provides a high-impedance circuit which comprises: a differential pair circuit composed of a first transistor and a second transistor; base current compensating means including an input transistor to which a signal is inputted, and cascade connection circuits and current mirror connection circuits which compensate a base current of the input transistor; and an impedance dividing circuit connected between the differential pair circuit and the base current compensating means for dividing input impedance of the transistors of the differential pair circuit.

Furthermore, the present invention provides a high-impedance circuit which comprises: a differential pair circuit composed of a first transistor and a second transistor; base current compensating means including an input transistor to which a signal is inputted, and cascade connection circuits and Darlington connection circuits which compensate a base current of the input transistor; and an impedance dividing circuit connected between the differential pair circuit and the base current compensating means for dividing input impedance of the transistors of the differential pair circuit.

In the present invention, by operating the transistors by a base driving system, the influence due to the stray capacitance is reduced, and an operation is made stable in a high-frequency region.

In accordance with the present invention, by decreasing the stray capacitance of the transistor circuit, and by reducing a signal variation such as a distortion which occurs in a high-frequency signal with simple circuit structure, it is possible to provide a resistor having high-impedance with a good characteristic.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a high-impedance circuit of a first embodiment according to the present invention;

FIG. 2 shows a high-impedance circuit of a second embodiment according to the present invention;

FIG. 14 shows a circuit diagram of an input selection circuit to which the high-impedance circuit according to the present invention can be applied;

DETAILED DESCRIPTION OF THE PREFERRED EMBODIMENTS

Figure 3:
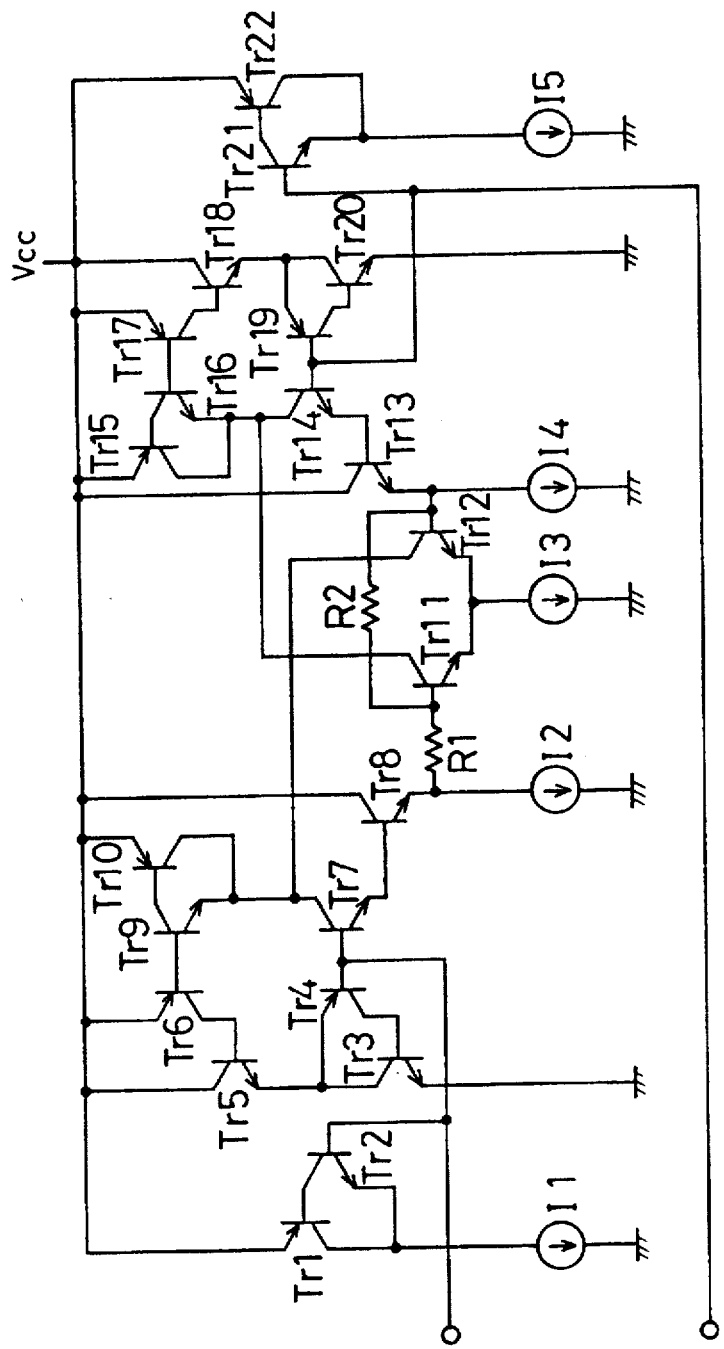
FIG. 3 shows a high-impedance circuit of a third embodiment according to the present invention.

FIG. 1 is a high-impedance circuit of a first embodiment according to the present invention. An input end is connected to bases of NPN type transistors Tr1 and Tr5 and a PNP type transistor Tr4. Emitters of the transistor Tr1 and the transistor Tr5 are connected to the ground via current sources I1 and I2, respectively, and a collector of the transistor Tr4 is directly connected to the ground.

A collector of a PNP type transistor Tr2 is connected to an emitter of the transistor Tr4, and a base of the transistor Tr2 is connected to a base of an NPN type transistor Tr3. An emitter of the transistor Tr3 is connected to a collector of the transistor Tr5. Therefore, the transistors Tr2 and Tr3 constitute a first current mirror circuit 2, and an emitter-collector current of the transistor Tr2 is equal to a collector-emitter current of the transistor Tr3. Furthermore, transistors Tr8 and Tr9 are connected to each other in a cascade fashion, and the transistors Tr3 and Tr5 are also connected to each other in a cascade fashion.

Then, an input circuit 5 is constructed by the transistors Tr2, Tr3, Tr4 and Tr5, and the current source I2.

A differential circuit 3 is constructed by NPN type transistors Tr6 and Tr7 having emitters commonly connected to the ground via a current source I3. A base of the transistor Tr6 is connected to an emitter of the transistor Tr5 via a resistor R1. Furthermore, a resistor R2 is connected between the bases of the transistors Tr6 and Tr7. A collector of the transistor Tr7 is connected to a connection point of the emitter of the transistor Tr3 of the first current mirror circuit 2 and the collector of the transistor Tr5.

In addition, the other input end is connected to bases of the NPN type transistors Tr8 and Tr12 and a PNP transistor Tr11. Emitters of the transistors Tr12 and Tr8 are connected to the ground via current sources I4 and I5, respectively. A collector of the transistor Tr11 is directly connected to the ground.

A collector of a PNP type transistor Tr10 is connected to an emitter of the transistor Tr11, and a base of the transistor Tr10 is connected to a base of the transistor Tr9. An emitter of the transistor Tr9 is connected to the collector of the transistor Tr8. Therefore, a second current mirror circuit 4 is constructed by the transistors Tr9 and Tr10, and an emitter-collector current I7 of the transistor Tr10 is made equal to a collector-emitter current of the transistor Tr9.

The collector of the transistor Tr6 of the differential circuit 3 is connected to a connection point of the emitter of the transistor Tr9 of the second current mirror circuit 4 and the collector of the transistor Tr8.

Next, with referring to FIG. 1, an operation will be described.

At first, the current source I3 of the differential circuit 3 is set to be approximately double the current source I1 of the transistor Tr1.

Then, a signal EI N inputted to the input ends is impedance-divided by the resistors R1 and R2 so as to be supplied to the differential circuit 3. Resultingly, the collector current I7 of the transistor Tr7 can be calculated according to the following equation (8) on the basis of the equation (3) of the conventional example.

$$I7 = E_{IN} \times \frac{R2}{R1 + R2} \times \frac{1}{2re} \quad (8)$$

Therefore, a current II N which is supplied through a path of the collector of the transistor Tr7, the transistor Tr3, the transistor Tr2, and the transistor Tr4 is evaluated by the following equation (9).

$$I_{IN} = E_{IN} \times \frac{R2}{R1+R2} \times \frac{1}{2re} \times \frac{1}{\beta n} \times \beta p \times \frac{1}{\beta p} \quad (9)$$

$$= E_{IN} \times \frac{R2}{R1+R2} \times \frac{1}{2re} \times \frac{1}{\beta n}$$

Therefore, an input resistor RI N can be evaluated by the following equation (10).

$$R_{IN} = \frac{E_{IN}}{I_{IN}} = \frac{R1+R2}{R2} \times 2re \times \beta n \quad (10)$$

In addition, a value of the differentiation resistor re is a value indicated by the equation (5) of the conventional example.

Accordingly, the input resistor becomes an equivalent resistor having a value of MΩ order. Furthermore, since the transistor Tr5 which is the input transistor is a transistor of a base driving system, in comparison with a collector driving system which is utilized in the prior art circuit, the stray capacitor between the base and the ground is small, and therefore, it is possible to reduce a distortion or the like in a high-frequency region.

Next, with referring to FIG. 2, a high-impedance circuit of a second embodiment according to the present invention will be described. FIG. 2 circuit is approximately similar to FIG. 1 circuit; however, a predetermined bias DC1 is applied to a signal inputted to the base of the transistor Tr8, i.e. the other input end, whereby the second current mirror circuit 4 and the transistors Tr11 and Tr12 (FIG. 1) can be eliminated. More specifically, in the second embodiment, a DC bias is connected to one end of the equivalent resistor RI N, and the one end becomes a low-impedance.

Resultingly, it is possible to obtain a high-impedance circuit similar to that of FIG. 1 without the above described circuit and the transistors.

Furthermore, FIG. 3 shows a high-impedance circuit of a third embodiment according to the present invention. The embodiment shown is a circuit in which outputs of the differential circuit is fed-back via Darlington circuits.

A PNP type transistor Tr1 and an NPN type transistor Tr2 are connected to each other in a Darlington fashion. That is, a base of the transistor Tr1 is connected to a collector of the transistor Tr2, and a collector of the transistor Tr1 is connected to an emitter of the transistor Tr2 such that a first Darlington circuit is constructed.

In addition, an NPN type transistor Tr3 and a PNP type transistor Tr4 are connected to each other in a Darlington fashion. That is, a base of the transistor Tr3 is connected to a collector of the transistor Tr4, and a collector of the transistor Tr3 is connected to an emitter of the transistor Tr4 such that a second Darlington circuit is constructed.

Furthermore, an NPN type transistor Tr5 and a PNP type transistor Tr6 are connected to each other in a Darlington fashion. That is, a base of the transistor Tr5 is connected to a collector of the transistor Tr6, and a collector of the transistor Tr5 is connected to an emitter of the transistor Tr6 such that a third Darlington circuit is constructed.

A PNP type transistor Tr9 and an NPN type transistor Tr10 are connected to each other in a Darlington fashion. That is, a base of the transistor Tr9 is connected to a collector of the transistor Tr10, and a collector of the transistor Tr9 is connected to an emitter of the transistor Tr10 such that a fourth Darlington circuit is constructed.

Furthermore, NPN type transistors Tr11 and Tr12 constitute a differential circuit, and emitters of the transistors of the differential circuit are commonly connected to the ground via a current source I3.

A PNP type transistor Tr15 and an NPN type transistor Tr16 which have the same structure as the above described structure and constructed in symmetry for a center of the differential circuit are connected to each other in a Darlington manner. That is, a base of the transistor Tr15 is connected to the transistor Tr16, and a collector of the transistor Tr15 is connected to an emitter of the transistor Tr16 such that a fifth Darlington circuit is constructed.

Furthermore, an NPN type transistor Tr17 and a PNP type transistor Tr18 are connected to each other in a Darlington fashion. That is, a base of the transistor Tr17 is connected to a collector of the transistor Tr18, and a collector of the transistor Tr17 is connected to an emitter of the transistor Tr18 such that a sixth Darlington circuit is constructed.

In addition, an NPN transistor Tr19 and a PNP type transistor Tr20 are connected to each other in a Darlington fashion. That is, a base of the transistor Tr19 is connected to a collector of the transistor Tr20, and a collector of the transistor Tr19 is connected to an emitter of the transistor Tr20 such that a seventh Darlington circuit is constructed.

An PNP type transistor Tr21 and an NPN type transistor Tr22 are connected to each other in a Darlington fashion. That is, a base of the transistor Tr21 is connected to a collector of the transistor Tr22, and a collector of the transistor Tr21 is connected to an emitter of the transistor Tr22 such that a eighth Darlington circuit is constructed.

A base of the first Darlington circuit and a base of the second Darlington circuit are connected to each other. A base of the third Darlington circuit and a base of the fourth Darlington circuit is connected to each other, and the second Darlington circuit and the third Darlington circuit are connected in series between a voltage source Vcc and the ground.

Similarly, a base of the seventh Darlington circuit and the base of the eighth Darlington circuit are connected to each other, and a base of the fifth Darlington circuit and a base of the sixth Darlington circuit are connected to each other, and the sixth Darlington circuit and the seventh Darlington circuit are connected to each other in series between the voltage source Vcc and the ground.

In consideration in a manner similar to that of FIG. 1 circuit, a current I<sub>IN</sub> flowing in the circuit of the embodiment is given by the following equation (11).

$$I_{IN} = E_{IN} \times \frac{R2}{R1+R2} \times \frac{1}{2re} \times \frac{1}{\beta p} \times \frac{1}{\beta n} \times \quad (11)$$

$$\beta p \times \beta n \times \frac{1}{\beta n} \times \frac{1}{\beta p}$$

$$= E_{IN} \times \frac{R2}{R1+R2} \times \frac{1}{2re} \times \frac{1}{\beta p} \times \frac{1}{\beta n}$$

Then, an equivalent resistor R<sub>IN</sub> is shown by the following equation (12).

$$R_{IN} = \frac{E_{IN}}{I_{IN}} = \frac{R1+R2}{R2} \times 2re \times \beta p \times \beta n \quad (12)$$

Therefore, in comparison with circuits shown in FIG. 1 and FIG. 2, it is possible to obtain a high-impedance circuit having an equivalent resistor of a value larger than that of the circuits by the current amplification factor β approximately.

Figure 4:
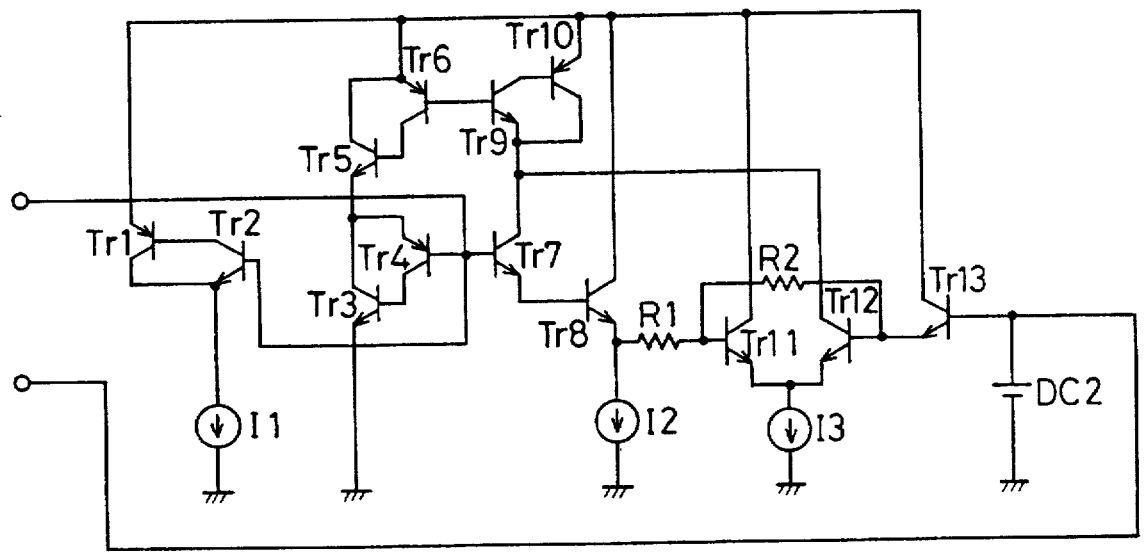
FIG. 4 shows a high-impedance circuit of a fourth embodiment according to the present invention.

Next, with referring to FIG. 4, a high-impedance circuit of a fourth embodiment according to the present invention will be described. The fourth embodiment is based on the thinking that FIG. 2 and FIG. 3 are combined with each other, and a predetermined bias DC2 is applied to a signal inputted to a base of the transistor Tr13, i.e. the other input end.

Therefore, the fifth Darlington circuit, the sixth Darlington circuit, the seventh Darlington circuit, and the eighth Darlington circuit, and the transistor Tr14 (FIG. 3) can be eliminated. More specifically, in the fourth embodiment, the DC bias DC2 is connected to one end of the equivalent resistor, and the one end becomes a low-impedance.

Resultingly, even if the above described Darlington circuits and the transistor are omitted, it is possible to obtain a high-impedance circuit similar to that of FIG. 3, and therefore, to reduce the number of components.

Figure 5:
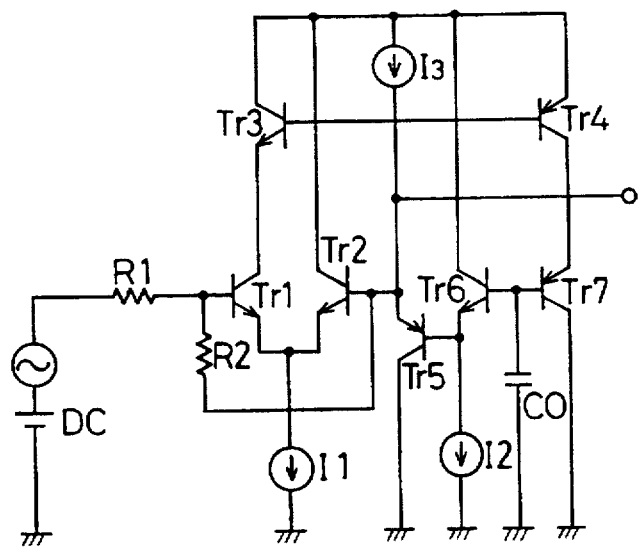
FIG. 5 shows an LPF of a high-impedance circuit of fifth embodiment according to the present invention.

FIG. 5 shows a fifth embodiment according to the present invention, which is a low-pass filter (hereinafter, called a "LPF") utilizing a high-impedance circuit.

A signal is voltage-divided by resistors R1 and R2, and inputted to bases of transistors Tr1 and Tr2 of a differential circuit. An emitter of the differential circuit is commonly connected to the ground via a current source I1. An emitter of an NPN type transistor Tr3 is connected to a collector of the transistor Tr1, and the transistor Tr3 and a PNP type transistor Tr4 constitute a first current mirror circuit.

Furthermore, a collector of the transistor Tr4 is connected to an emitter of a PNP type transistor Tr7. The transistor Tr7 constitutes a second current mirror circuit together with an NPN type transistor Tr6.

An emitter of the transistor Tr6 is connected to a base of the transistor Tr2 of the differential circuit via a base and an emitter of a PNP type transistor Tr5.

Furthermore, a current source I3 is connected between a base of the transistor Tr2 and a power source line. The current source I3 is for making a current flow into the transistor Tr5, and therefore, may be a resistor.

Bases of the transistors Tr6 and Tr7 are commonly connected to the ground via a capacitor C0.

A current source I2 (I1=2×I2) connected to the collector of the transistor Tr7, and the base of the transistor Tr5 and the emitter of the transistor Tr6, respectively is connected to the ground.

An output is withdrawn from the emitter of the transistor Tr5, but the same may be withdrawn a common base of the transistors Tr6 and Tr7.

A differentiation circuit is equivalently constructed by the high-impedance circuit and the capacitor C0, thereby to construct an LPF. Since a resistance value of the LPF is very large, it is possible to obtain an LPF having a long time constant.

It is needless to say that an LPF utilizing the present invention can be used in a synchronization separation circuit, a signal processing circuit and etc. of a television receiver, a video tape recorder and etc.

Figure 6:
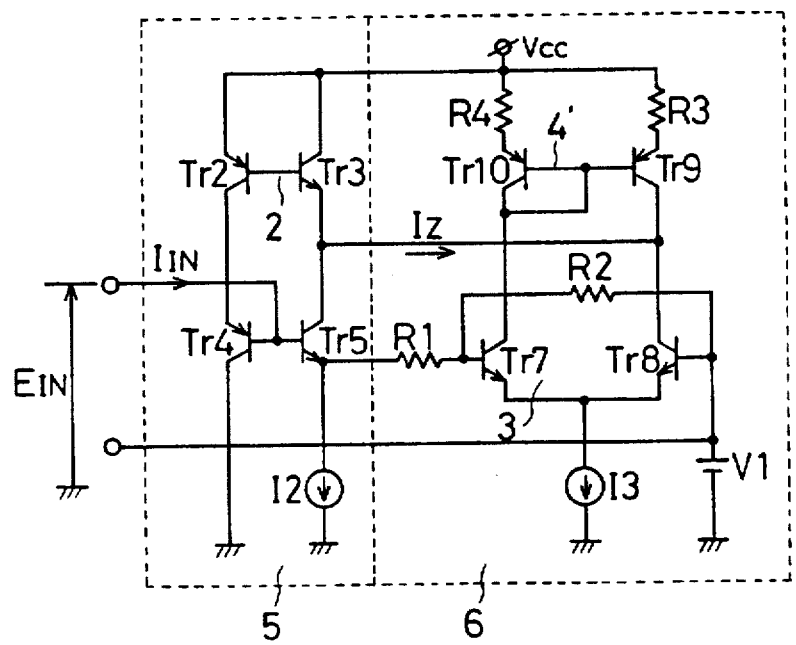
FIG. 6 shows a high-impedance circuit of a sixth embodiment according to the present invention.

FIG. 6 shows a high-impedance circuit of a sixth embodiment. An input circuit 5 is the same as that of the first embodiment, and therefore, a description thereof will be omitted here.

To the input circuit 5, a differential circuit 3 is connected. In the differential circuit 3 emitters of NPN type transistors Tr7 and Tr8 are connected to each other, and a current source I3 is connected to such a connection portion, and a resistor R2 is connected between bases of the transistors Tr7 and Tr8, and a resistor R1 is connected to the base of the transistor Tr7 so as to voltage-divide an input signal together with the resistor R2. A base and a collector of a PNP type transistor Tr10 are connected to each other, and a base of a PNP type transistor Tr9 is connected to the base of the transistor Tr10, and therefore, the transistor Tr9 constitutes a current mirror circuit 4' together with the transistor Tr10. Resistors R4 and R3 are connected between emitters of the transistors Tr10 and Tr9 and the voltage source Vcc, respectively, and emitters of the transistors Tr8 and Tr7 of the differential circuit 3 are connected to the collectors of the transistors Tr9 and Tr10 of the current mirror circuit 4'. Thus, a high-impedance portion 6 is formed. However, resistance values of the resistors R3 and R4 are made equal to each other (R3=R4), whereby currents having the same current value flow into the transistors Tr10 and Tr9, respectively.

In addition, one input end is connected to a base of the transistor Tr7 via the resistor R1 from the input circuit 5, and the other input end is connected to a base of the transistor Tr8 which is biased by a constant voltage source V1.

It is evaluated on the basis of the following equation (13) that the circuit 6 is a high-impedance circuit as similar to the equation (8). In the equation (13), an input voltage EIN becomes equal to an emitter voltage of the transistor Tr5 in an alternating current.

$$Ic8 = E_{IN} \times \frac{R2}{R1+R2} \times \frac{1}{2re} \qquad (13)$$

With referring to FIG. 6, an operation will be described, and the impedance is evaluated.

At first, it is assumed that a base current of the transistor Tr7 is larger than a base current of the transistor Tr8. At this time, a current Ia flows between a collector and an emitter of the transistor Tr7, which is larger than that of the transistor Tr8. Then, a sum of the current Ia between the collector and the emitter of the transistor Tr7 and a current Ib between a collector and an emitter of the transistor Tr8 is always a constant current I3 due to the differential circuit 3. A relationship between the current Ia and the current Ib, and the current source I3 is shown by the following equation (14). In addition, the current Ia also flows in the transistor Tr10, whereby the current Ia flows in the transistor Tr9 which is connected to the transistor Tr10 in a current mirror fashion. In addition, a current Δ I is a difference of the currents of the transistors, which occurs due to a difference of input voltages of the differential circuit.

$$Ia = \frac{I3}{2} - \Delta I \qquad (14)$$

$$Ib = \frac{I3}{2} - \Delta I$$

$$Iz = Ib - Ia$$

$$Iz = \frac{I3}{2} + \Delta I - \left(\frac{I3}{2} - \Delta I\right)$$

$$= 2\Delta I$$

Then, only the current Ib flows in the transistor Tr8, and therefore, a current Iz= (Ib–Ia) negatively flows through the collector of the transistor Tr9 and the collector of the transistor Tr5. However, since only the current I2 flows between the collector and the emitter of the transistor Tr5 due to the current source I2, because of a fact that the current Iz flows thereinto, a current of the collector of the transistor Tr3 is decreased by the current Iz.

Therefore, the base currents of the transistors Tr3 and Tr2 are also decreased, and the emitter current of the transistor Tr4, and the base current of the transistor Tr4, and thus, the emitter current of the transistor Tr5 are also decreased. Furthermore, since a path between the emitter of the transistor Tr5 and the ground is fixed at the current I2 by the constant current source I2, a current flows into the base of the transistor Tr7 via the resistor R1 is decreased, whereby the base current of the transistor Tr7 becomes equal to the base current of the transistor Tr8.

Furthermore, it is assumed that the base current of the transistor Tr7 is smaller than the base current of the transistor Tr8. At that time, a current Ia flows between the collector and the emitter of the transistor Tr7, which is smaller than that of the transistor Tr8.

Then, the current Iz positively flows through the emitter of the transistor Tr3 and the collector of the transistor Tr8. However, only the current I2 flows between the collector and the emitter of the transistor Tr5 due to the current source I2, and therefore, if a current Δ I flows out the emitter of the transistor Tr3, the emitter current of the transistor Tr3 is increased.

Accordingly, the base currents of the transistors Tr3 and Tr2 are increased, and therefore, the emitter current of the transistor Tr4, the base current of the transistor Tr4, and thus, the emitter current of the transistor Tr5 are also increased. Furthermore, since a path between the emitter of the transistor Tr5 and the ground is fixed at the current I2 by the constant current source I2, and therefore, a current flows into the base of the transistor Tr7 via the resistor R1 is increased, whereby the base current of the transistor Tr7 becomes equal to the base current of the transistor Tr8.

Accordingly, since the current I3 is a constant due to the constant current source, the current Iz becomes a current which is in proportion to double the current Ia or Ib. Therefore, in accordance with the following equation (15), the input current I I N and the input resistor R I N can be evaluated.

$$Iz = 2\Delta I \qquad (15)$$

$$= 2 \times Ic8$$

$$= E_{IN} \times \frac{R2}{R1+R2} \times \frac{1}{re}$$

$$I_{IN} = Iz \times \frac{1}{\beta n}$$

$$= E_{IN} \times \frac{R2}{R1+R2} \times \frac{1}{re} \times \frac{1}{\beta n}$$

$$\therefore R_{IN} = \frac{E_{IN}}{I_{IN}} = \frac{R1+R2}{R2} \times re \times \beta n$$

Therefore, it will be understood that the input resistor becomes a resistor having a few or several MΩ order. Accordingly, it is possible to obtain a circuit having high-impedance and being not affected by the stray capacitors.

Figure 7:
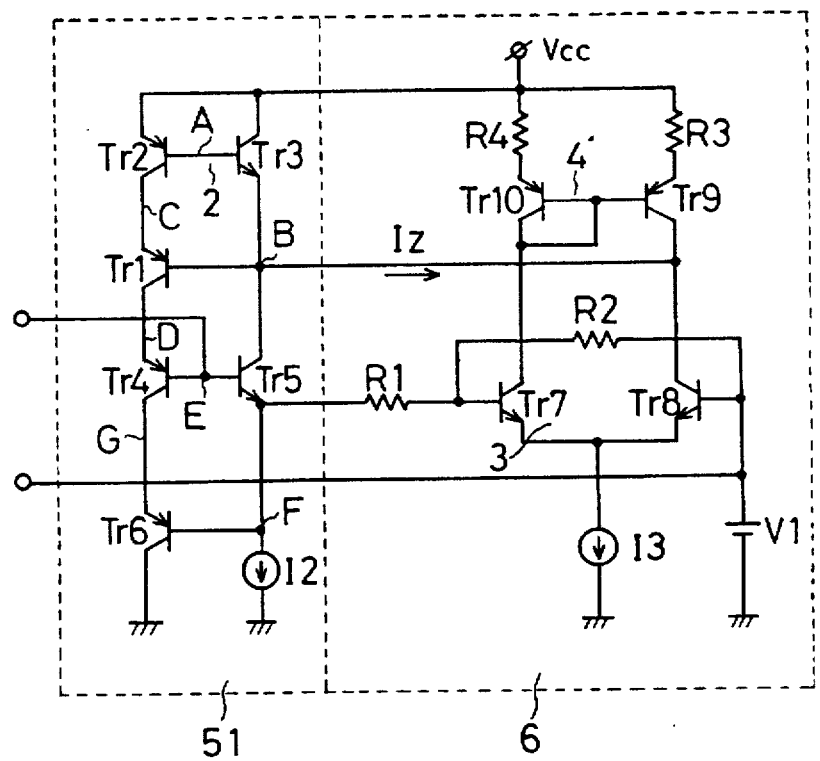
FIG. 7 shows a high-impedance circuit of a seventh embodiment according to the present invention.

FIG. 7 shows a high-impedance circuit of a seventh embodiment according to the present invention.

One input end is connected to bases of an NPN type transistor Tr5 and a PNP type transistor Tr4 which are connected to each other in a current mirror fashion. An emitter of the transistor Tr5 is connected to the ground via a current source I2. The other input end is connected to a base of a transistor Tr8 of a differential circuit 3 as similar to the sixth embodiment.

An emitter of PNP type transistor Tr6 is connected to a collector of the transistor Tr4, and a base of the transistor Tr6 is connected to a connection point of the emitter of the transistor Tr5 and the current source I2, and a collector of the transistor Tr6 is connected to the ground.

Furthermore, a collector of a PNP type transistor Tr2 which is connected to an NPN type transistor Tr3 in a current mirror fashion is connected to an emitter of an PNP type transistor Tr1. A base of the transistor Tr1 is connected to an emitter of the transistor Tr3, and a connection point thereof is connected to a collector of the transistor Tr5, and a collector of the transistor Tr1 is connected to an emitter of the transistor Tr4.

Accordingly, the transistor Tr2, the transistor Tr1, the transistor Tr4 and the transistor Tr6 are connected to each other in a cascade fashion, whereby the same current flows in each of the transistors, respectively.

An input circuit 51 is constructed by the transistors Tr1, Tr2, Tr3, Tr4, Tr5 and Tr6 and the current source I2. Furthermore, a high-impedance portion 6 which is connected to the input circuit 51 is constructed in a manner similar to that of the sixth embodiment.

Next, the input circuit 51 will be described. A power source is the voltage $V_{cc}$, and therefore, a voltage at a point A of the bases of the transistors Tr2 and Tr3 becomes $V_{CC}$-$V_{BE}$, and a voltage at a point B of the emitter of the transistor Tr3, the base of the transistor Tr1 and the collector of the transistor Tr5 becomes $V_{CC}$-$2V_{BE}$. Accordingly, a voltage at a point C of the emitter of the transistor Tr1 becomes $V_{CC}$-$V_{BE}$, and a voltage between the collector and the emitter of the transistor Tr2 becomes $V_{BE}$, and therefore, the collector current of the transistor Tr2 becomes equal to the collector current of the transistor Tr3.

Furthermore, this is also applied to the transistors Tr4, Tr5 and Tr6. Therefore, if a voltage at a point D is $V_D$, a voltage at a point E of the bases of the transistors Tr4 and Tr5 becomes $V_D$-$V_{BE}$, a voltage at a point F of the emitter of the transistor Tr5 and the base of the transistor Tr6 becomes $V_D$-$2V_{BE}$. Accordingly, a voltage at a point G becomes $V_D$-$V_{BE}$, and a voltage between the collector and the emitter of the transistor Tr4 becomes $V_{BE}$, and therefore, the collector current of the transistor Tr4 becomes equal to the collector current of the transistor Tr5.

Then, in the input circuit 5 shown by the sixth embodiment, the voltages between the emitters and the collectors of the respective transistors Tr4 and Tr2 are varied by the input level. Therefore, the collector currents of the transistor Tr4 and the transistor Tr3 are varied (Early effect), and therefore, the collector currents of the both transistors do not become to be coincident with each other. More specifically, since the base current flowing into the transistor Tr5 and the base current flowing out the transistor Tr4 are different from each other, a current flows, and thus, it was impossible to obtain a high-impedance circuit having a sufficiently large impedance. In contrast, in the embodiment which is constructed in the above described manner, the voltages of the collector and the emitter of the two transistors which are connected to each other in a cascade fashion become to be equal to each other, and therefore, the collector currents thereof also become equal to each other. Resultingly, it will be understood that the compensation of the base current is surely performed.

Next, an operation of the whole circuit structure will be described. The current Iz becomes negative (a direction shown by an arrow mark is positive) when the current Ia of the transistor Tr7 is increased in comparison with a balanced state, and the current Iz is positive when the current Ib of the transistor Tr8 is increased, as shown by the equation (14) and the equation (15).

Therefore, when the current Iz is negative, that is, the base current of the transistor Tr7 is larger than the base current of the transistor Tr8, the current Iz flows into the collector of the transistor Tr5, but the constant current source I2 is constant, and accordingly, the emitter current of the transistor Tr3 is decreased.

Then, the common base current of the transistors Tr3 and Tr2 is decreased, and therefore, the emitter-collector current of the transistor Tr2 is also decreased. Because of the cascade connection, the decrease of the current makes the emitter-collector currents of the transistors Tr1, Tr4 and Tr6 be decreased. The emitter current of the transistor Tr4 is decreased, and therefore, the base current of the transistor Tr4 is also decreased, and accordingly, the emitter current of the transistor Tr5 is decreased.

Then, a constant current flows into the current source I2, and therefore, a current flowing into the base of the transistor Tr7 via the resistor R1 is decreased, and accordingly, the base current of the transistor Tr7 and the base current of the transistor Tr8 are balanced with each other.

Accordingly, the input resistor becomes a resistor having a resistance value of $M\Omega$ order. Furthermore, since the transistor Tr5 which is the input transistor is a transistor of a base driving system, in comparison with a collector driving system utilized in the conventional circuit, the stray capacitor becomes small, and therefore, it is possible to improve the characteristic in a high-frequency region.

Figure 8:
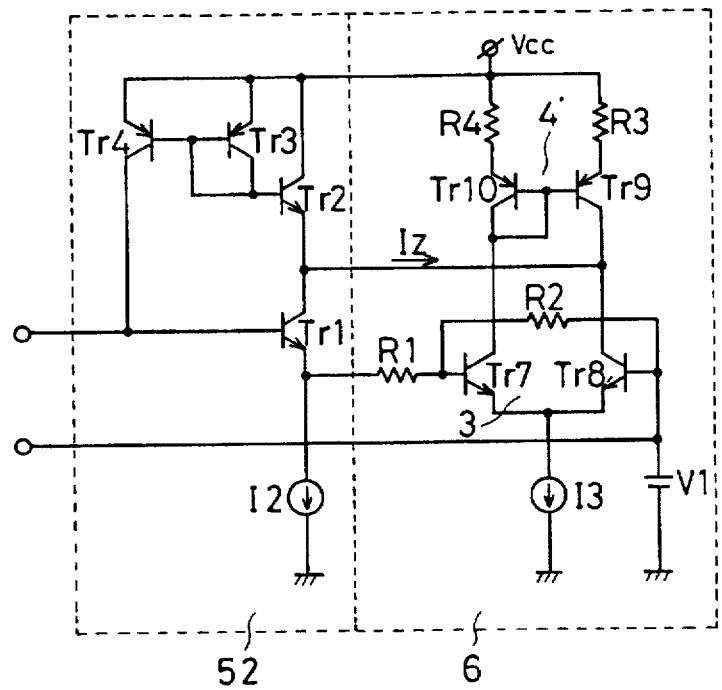
FIG. 8 is a high-impedance circuit of a eighth embodiment according to the present invention.

FIG. 8 shows a high-impedance circuit according to an eighth embodiment.

One input end is connected to a base of an NPN type transistor Tr1. An emitter of the transistor Tr1 is connected to the ground via a current source I2. The other input end is connected to a base of a transistor Tr8 of a differential circuit 3 in a manner similar to that of the sixth embodiment.

A collector of a PNP type transistor Tr4 is connected to the base of the transistor Tr1, and a base of the transistor Tr4 is connected to a base of an NPN type transistor Tr3 so as to form a current mirror circuit. A collector of the transistor Tr3 is connected to the base thereof, and to a base of an NPN type transistor Tr2.

The transistors Tr1 and Tr2 are connected to each other in a cascade fashion.

An input circuit 52 is constructed by the transistors Tr1, Tr2, Tr3 and Tr4, and the current source I2. Furthermore, a high-impedance portion 6 connected to the input circuit 52 is constructed in a manner similar to that of the sixth embodiment.

Next, an operation of the whole circuit structure will be described. The current Iz becomes negative (a direction shown by an arrow mark is positive) when the current Ia of the transistor Tr7 is increased in comparison with a balanced state, and the current Iz is positive when the current Ib of the transistor Tr8 is increased, as shown by the equation (14) and the equation (15).

Therefore, when the current Iz is negative, that is, the base current of the transistor Tr7 is larger than the base current of the transistor Tr8, the current Iz flows into the collector of the transistor Tr1, but the constant current source I2 is constant, and accordingly, the emitter current of the transistor Tr3 is decreased.

Accordingly, the base current of the transistor Tr2 is decreased, and the current of the transistor Tr3 is also decreased, and thus, the emitter-collector current of the transistor Tr4 is decreased due to the current mirror connection.

Since the emitter current of the transistor Tr4 is decreased, the base current of the transistor Tr1 is also decreased, and therefore, the emitter current of the transistor Tr1 is decreased.

Then, since the constant current flows into the current source I2, a current which is inputted to the base of the transistor Tr7 via the resistor R1 is decreased, and accordingly the base current of the transistor Tr7 and the base current of the transistor Tr8 are balanced with each other.

When the current Iz is positive, that is, the base current of the transistor Tr7 is smaller than the base current of the transistor Tr8, the current Iz flows into the collector of the transistor Tr8, but the constant current source I2 is constant, and accordingly, the emitter current of the transistor Tr3 is increased. Therefore, the currents of the transistors Tr2, Tr3, Tr4 and Tr1 are also increased, and accordingly, the base current of the transistor Tr7 and the base current of the transistor Tr8 are balanced with each other.

Accordingly, almost no current flows in the circuit, and therefore, the input resistor becomes a resistor having a resistance value of MΩ order.

Figure 9:
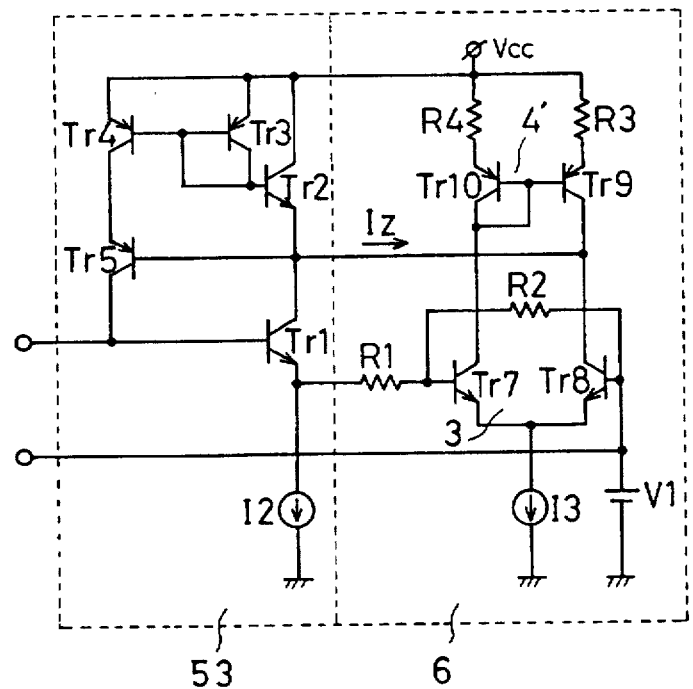
FIG. 9 shows a high-impedance circuit of a ninth embodiment according to the present invention.

FIG. 9 shows a high-impedance circuit according to a ninth embodiment.

One input end is connected to a base of an NPN type transistor Tr1. An emitter of the transistor Tr1 is connected to the ground via a current source I2. The other input end is connected to a base of a transistor Tr8 of a differential circuit 3 in a manner similar to that of the sixth embodiment.

A collector of a PNP type transistor Tr4 is connected to an emitter of a PNP type transistor Tr5 in a cascade fashion, and a base of the transistor Tr4 is connected to a base of an NPN type transistor Tr3 so as to form a current mirror circuit. A collector of the transistor Tr3 is connected to the base thereof, and to a base of an NPN type transistor Tr2.

In addition, a collector of the transistor Tr5 is connected to the base of the transistor Tr1, and the base of the transistor Tr5 is connected to a connection point of the transistors Tr1 and Tr2 which are connected to each other in a cascade fashion.

An input circuit 53 is constructed by the transistors Tr1, Tr2, Tr3, Tr4 and Tr5, and the current source I2. Furthermore, a high-impedance portion 6 connected to the input circuit 53 is constructed in a manner similar to that of the sixth embodiment.

Next, an operation of the whole circuit structure will be described. When the current Iz is negative, that is, the base current of the transistor Tr7 is larger than the base current of the transistor Tr8, the current Iz flows into the collector of the transistor Tr5, but the constant current source I2 is constant, and accordingly, the emitter current of the transistor Tr2 is decreased.

Accordingly, the base current of the transistor Tr2 is decreased, and the current of the transistor Tr3 is also decreased, and thus, the emitter-collector current of the transistor Tr4 is decreased due to the current mirror connection. Furthermore, due to the cascade connection, the current of the transistor Tr5 is also decreased.

Since the collector current of the transistor Tr5 is decreased, the base current of the transistor Tr1 is also decreased, and therefore, the emitter current of the transistor Tr1 is decreased.

Then, since the constant current flows into the current source I2, a current which is inputted to the base of the transistor Tr7 via the resistor R1 is decreased, and accordingly, the base current of the transistor Tr7 and the base current of the transistor Tr8 are balanced with each other.

When the current Iz is positive, that is, the base current of the transistor Tr7 is smaller than the base current of the transistor Tr8, the current Iz flows into the collector of the transistor Tr8, but the constant current source I2 is constant, and accordingly, the emitter current of the transistor Tr3 is increased. Therefore, the currents of the transistors Tr2, Tr3, Tr4, Tr5 and Tr1 are also increased, and accordingly, the base current of the transistor Tr7 and the base current of the transistor Tr8 are balanced with each other.

Accordingly, almost no current flows in the circuit, and therefore, the input resistor becomes a resistor having a resistance value of MΩ order. In addition, the ninth embodiment is difference from the eighth embodiment in a point that by connecting the transistor Tr5 to the transistor Tr4, the emitter-collector voltage of the transistor Tr4 can be maintained at a predetermined value, and the collector currents of the transistors Tr4 and Tr3 can be made be coincident with each other, and therefore, no influence due to the Early effect occurs.

Figure 10:
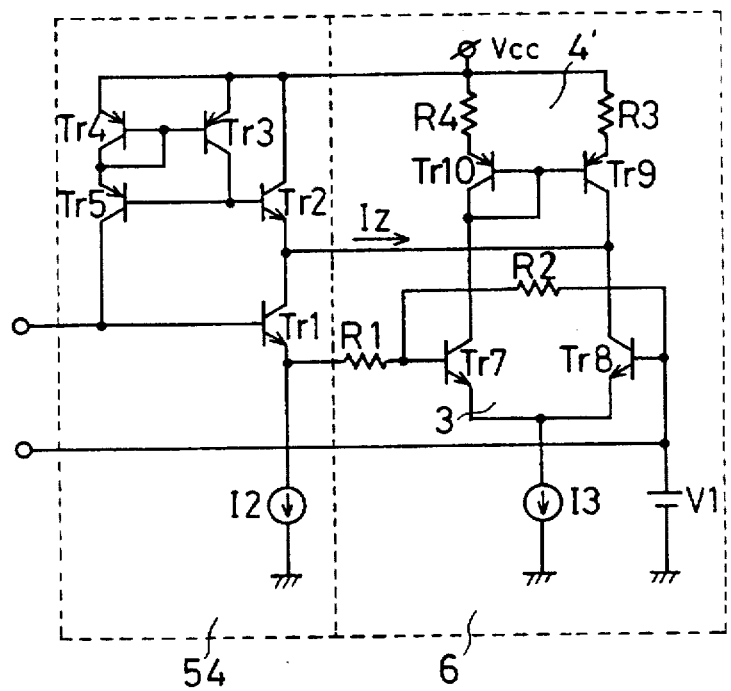
FIG. 10 shows a high-impedance circuit of a tenth embodiment according to the present invention.

FIG. 10 shows a high-impedance circuit according to a tenth embodiment.

One input end is connected to a base of an NPN type transistor Tr1. An emitter of the transistor Tr1 is connected to the ground via a current source I2. The other input end is connected to a base of a transistor Tr8 of a differential circuit 3 in a manner similar to that of the sixth embodiment.

A collector of a PNP type transistor Tr4 is connected to an emitter of a PNP type transistor Tr5 in a cascade fashion, and a base of the transistor Tr4 is connected to a base of an NPN type transistor Tr3 so as to form a current mirror circuit. A collector of the transistor Tr4 is connected to the base thereof.

In addition, a collector of the transistor Tr5 is connected to the base of the transistor Tr1, and a base of the transistor Tr5 is connected to a base of an NPN type transistor Tr2 so as to form a current mirror fashion, and to a collector of the transistor Tr3

An input circuit 54 is constructed by the transistors Tr1, Tr2, Tr3, Tr4 and Tr5, and the current source I2. Furthermore, a high-impedance portion 6 connected to the input circuit 53 is constructed in a manner similar to that of the sixth embodiment. Now, the input circuit 54 is called, in general, as a Wilson's current mirror circuit.

Next, an operation of the whole circuit structure will be described. When the current Iz is negative, that is, the base current of the transistor Tr7 is larger than the base current of the transistor Tr8, the current Iz flows into the collector of the transistor Tr1, but the constant current source I2 is constant, and accordingly, the emitter current of the transistor Tr2 is decreased.

Accordingly, the base current of the transistor Tr2 is decreased, and the current of the transistor Tr3 is also decreased, and thus, the emitter-collector current of the transistor Tr4 is decreased due to the current mirror connection. Furthermore, due to the cascade connection, the current of the transistor Tr5 is also decreased.

Since the collector current of the transistor Tr5 is decreased, the base current of the transistor Tr1 is also decreased, and therefore, the emitter current of the transistor Tr1 is decreased.

Then, since the constant current flows into the current source I2, a current which is inputted to the base of the transistor Tr7 via the resistor R1 is decreased, and accordingly, the base current of the transistor Tr7 and the base current of the transistor Tr8 are balanced with each other.

Accordingly, almost no current flows in the circuit, and therefore, the input resistor becomes a resistor having a resistance value of MΩ order. In addition, in the tenth embodiment, by forming the Wilson's current mirror circuit, the emitter-collector voltage of the transistor Tr4 can be maintained at a predetermined value, and the collector currents of the transistors Tr4 and Tr3 can be made be coincident with each other, and therefore, no influence due to the Early effect occurs.

Figure 11:
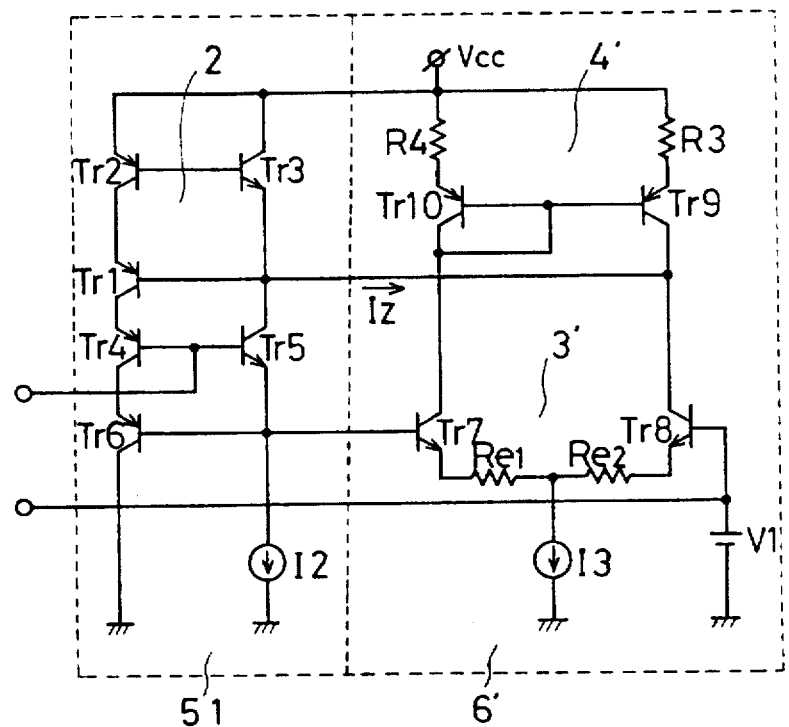
FIG. 11 shows a high-impedance circuit of an eleventh embodiment according to the present invention.

FIG. 11 shows a high-impedance circuit of a eleventh embodiment.

An input circuit 51 is the same as that of the seventh embodiment.

To the input circuit 51, a differential circuit 3' is connected. In the differential circuit 3', resistors Re1 and Re2 are connected in series between emitters of NPN type transistors Tr7 and Tr8, and a current source I3 is connected to such a connection portion. A base and a collector of a PNP type transistor Tr10 are connected to each other, and a PNP type transistor Tr9 is connected to the base of the transistor Tr10, and the transistor Tr9 constitutes a current mirror circuit 4' together with the transistor Tr10. Resistors R4 and R3 are connected between emitters of the transistors Tr10 and Tr9 and the voltage source $V_{cc}$, respectively, and emitters of the transistors Tr8 and Tr7 of the differential circuit 3 are connected to the collectors of the transistors Tr9 and Tr10 of the current mirror circuit 4', respectively. Thus, a high-impedance portion 6 is formed. However, resistance values of the resistors R3 and R4 are made equal to each other (R3=R4), whereby currents having the same current value flow into the transistors Tr10 and Tr9, respectively.

In other word, the high-impedance portion 6' is a circuit obtained by replacing the resistors R1 and R2 of the above described high-impedance portions 6 with the resistors Re1 and Re2, respectively. The resistors R1 and R2 are set at values by which the signal levels inputted to the differential circuit 3 can be included within a linearly operating region of the differential circuit 3, that is, a linear region. For example, the value of the resistor R1 is set so as to become very larger than the value of the resistor R2 (few or several tens to few or several hundreds times).

Furthermore, the linear region has a relationship to emitter resistors (differentiation resistors) of the differential pair, and therefore, the larger differentiation resistor, the wider linear region.

Therefore, in the eleventh embodiment, it is possible to expand the linear region by connecting the resistors Re1 and Re2 to the differentiation resistors re in series, respectively, to increase a resistance value at emitter sides. Accordingly, even if an input signal having a relatively larger level is inputted to the differential circuit 3', the differential circuit 3' can operate within the linear region.

That is, even if the resistors R1 and R2 are replaced with the resistors Re1 and Re2, the resistor becomes a resistor having a resistance value of MΩ order, as similar to the sixth embodiment. Furthermore, since the transistor Tr5 which is the input transistor is a transistor of a base driving system, in comparison with a collector driving system utilized in the prior art circuits, the stray capacitor between the base and the ground is decreased, and therefore, it is possible to increase the characteristic in a high-frequency region.

Figure 12:
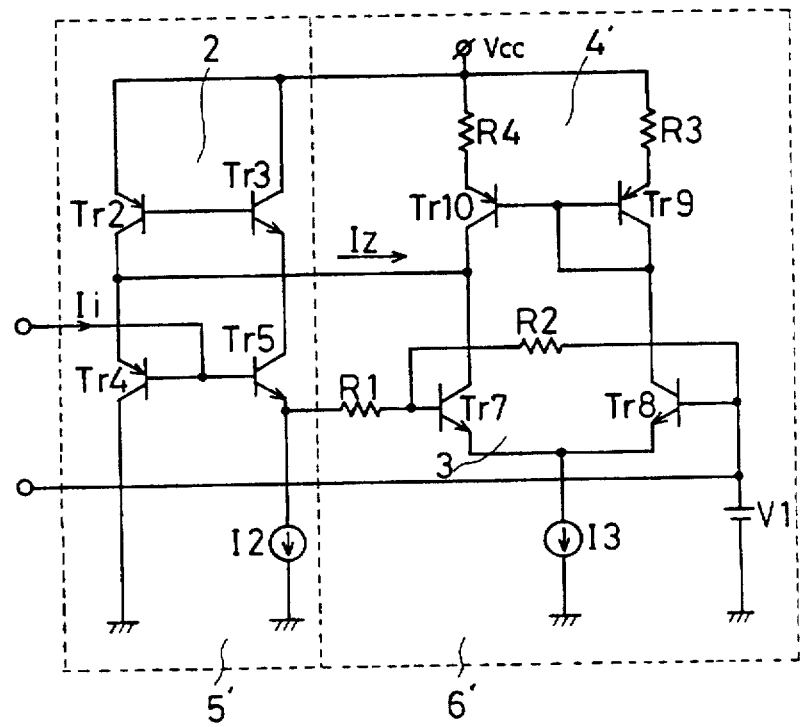
FIG. 12 shows a high-impedance circuit of a twelfth embodiment according to the present invention.

FIG. 12 shows a high-impedance circuit of a twelfth embodiment.

An input circuit 5' has circuit structure similar to that of the sixth embodiment; however, the feed-back from the differential circuit 3 is performed at a connection point of the transistors Tr2 and Tr4 rather than a connection point of the transistors Tr3 and Tr5.

Furthermore, a high-impedance portion 6' has circuit structure similar to that of the sixth embodiment; however, the former is different from the latter in a point that a diode connection (a base of a PNP type transistor is connected to a collector thereof) is applied to the transistor Tr10 in the sixth embodiment, but in the twelfth embodiment, the diode connection is applied to the transistor Tr9 which is connected to the transistor Tr10 in a current mirror fashion, and the input circuit 5' is connected to a connection point of the transistor Tr10 and the transistor Tr7.

That is, in the twelfth embodiment, a portion from which the high-impedance portion 61 is fed-back is the other output end of the differential circuit 3, and therefore, a transistor to which the diode connection is applied is changed in the high-impedance portion 61, and accordingly, the other end of the current mirror circuit 2 receives the feed-back to the input circuit 5'.

In addition, the high-impedance portion 6' and the input circuit 5' operate in manners similar to that of the high-impedance portion 6 and the input circuit 5 of the former embodiments, respectively.

Next, with referring to FIG. 12, the twelfth embodiment will be described.

At first, it is assumed that the base voltage of the transistor Tr7 becomes larger than the base voltage of the transistor Tr8. At that time, as described above, the currents Ia and Ib flow in the emitters and the collectors of the transistors Tr7 and Tr8, respectively.

Furthermore, the current Ib of the transistor Tr8 also flows in the transistor Tr9 having the diode connection. Accordingly, the current of the transistor Tr9 flows in the transistor Tr10 which is connected to the transistor Tr9 in a current mirror fashion; however, since the current Ia flows in the transistor Tr7, a current Iz'=2×Δ I, which is a difference (Ia−Ib) of the currents Ia and Ib, flows into the collector of the transistor Tr7 from the collector of the transistor Tr2.

The current flowing in the transistor Tr2 is determined by the transistor Tr3, and thus, constant, and accordingly, the current of the transistor Tr4 is decreased by the current flowing into the transistor Tr7. Therefore, the current of the transistor Tr5 is decreased while the current source I2 is constant, and therefore, the base voltage of the transistor Tr7 is decreased.

Therefore, the transistors Tr7 and Tr8 are balanced with each other.

Furthermore, in a case where the base voltage of the transistor Tr7 becomes smaller than the base voltage of the transistor Tr8, the current Iz becomes opposite direction, and therefore, the current of the transistor Tr4 is increased. Therefore, the current of the transistor Tr5 is increased, and the base current of the transistor Tr7 is increased, and accordingly, the base voltage of the transistor Tr7 is increased, whereby the base voltages of the transistors Tr7 and Tr8 become equal to each other such that the transistors Tr7 and Tr8 are balanced with each other.

Accordingly, the resistor becomes a resistor having a resistance value of MΩ order. Furthermore, since the transistor Tr5 which is the input transistor is a transistor of a base driving system, in comparison with a collector driving system utilized in the prior art circuits, the stray capacitor of the transistor Tr5 is reduced, and therefore, it is possible to improve the characteristic in a high-frequency region.

Figure 13:
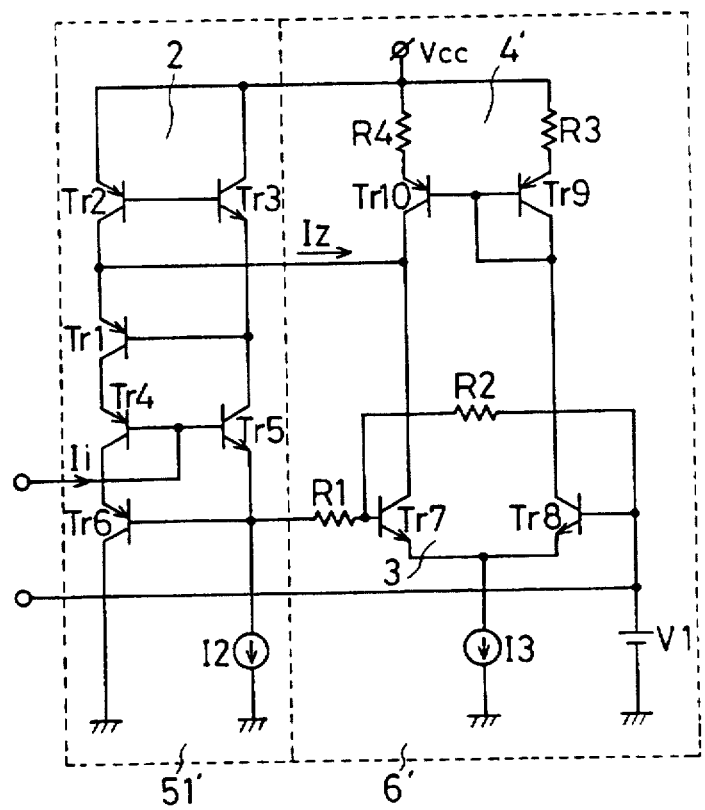
FIG. 13 shows a high-impedance circuit of a thirteenth embodiment according to the present invention.

FIG. 13 shows a high-impedance circuit of a thirteenth embodiment.

An input circuit 51' has circuit structure similar to that of the seventh embodiment; however, the feed-back from the differential circuit 3 is performed at a connection point of the transistors Tr2 and Tr1 rather than a connection point of the transistors Tr3 and Tr5.

Furthermore, a high-impedance portion 61 has circuit structure similar to that of the twelfth embodiment.

That is, in the thirteenth embodiment, a portion from which the high-impedance portion 61 is fed-back is the other output end of the differential circuit 3, and therefore, a transistor to which the diode connection is applied is changed in the high-impedance portion 61, and accordingly, the other end of the current mirror circuit 2 receives the feed-back to the input circuit 51'.

In addition, the high-impedance portion 61 and the input circuit 51' operate in manners similar to that of the high-impedance portion 6 and the input circuit 5 of the former embodiments, respectively.

Next, with referring to FIG. 13, the thirteenth embodiment will be described.

At first, it is assumed that the base voltage of the transistor Tr7 becomes larger than the base voltage of the transistor Tr8. At that time, as described above, the currents Ia and Ib flow in the emitters and the collectors of the transistors Tr7 and Tr8, respectively.

Furthermore, the current Ib of the transistor Tr8 also flows in the transistor Tr9 having the diode connection. Accordingly, the current of the transistor Tr9 flows in the transistor Tr10 which is connected to the transistor Tr9 in a current mirror fashion; however, since the current Ia flows in the transistor Tr7, a current $Iz'=2\times\Delta I$, which is a difference (Ia–Ib) of the currents Ia and Ib, flows into the collector of the transistor Tr7 from the collector of the transistor Tr2.

The current flowing in the transistor Tr2 is determined by the transistor Tr3, and thus, constant, and accordingly, the current of the transistor Tr4 is decreased by the current flowing into the transistor Tr7. Therefore, the current of the transistor Tr5 is decreased while the current source I2 is constant, and therefore, the base voltage of the transistor Tr7 is decreased.

Therefore, the transistors Tr7 and Tr8 are balanced with each other.

Furthermore, in a case where the base voltage of the transistor Tr7 becomes smaller than the base voltage of the transistor Tr8, the current Iz becomes opposite direction, and therefore, the current of the transistor Tr4 is increased. Therefore, the current of the transistor Tr5 is increased, and the base current of the transistor Tr7 is increased, and accordingly, the base voltage of the transistor Tr7 is increased, whereby the base voltages of the transistors Tr7 and Tr8 become equal to each other such that the transistors Tr7 and Tr8 are balanced with each other.

Accordingly, the resistor becomes a resistor having a resistance value of MΩ order. Furthermore, since the transistor Tr5 which is the input transistor is a transistor of a base driving system, in comparison with a collector driving system utilized in the prior art circuits, the stray capacitor of the transistor Tr5 is reduced, and therefore, it is possible to improve the characteristic in a high-frequency region.

In addition, in the above, various embodiments are described, but it is needless to say that the present invention can be embodied in arbitrary combination of the input circuit and the high-impedance portion.

With referring to FIG. 14, an input selection circuit 40 is a circuit for selecting or switching external inputs to a television signal processing apparatus such as a television receiver, VTR and etc., and includes input terminals 42a and 42b. The input terminals 42a and 42b respectively receive "video 1" input and "video 2" input, for example. The input terminals 42a and 42b are connected to bases of NPN type transistors Qa and Qb through coupling capacitors 44a and 44b each having a capacitance value of 0.01 μF, for example. The bases of the transistors Qa and Qb are connected to the ground through series connection circuits of high-impedance circuits 10a and 10b and direct current voltages Vref. Emitters of the transistors Qa and Qb are connected to contacts 46a and 46b of a switch 46, and a contact 46c of the switch 46 is connected to an output of a tuner. Therefore, by switching the switch 46, "video 1" input from the input terminal 42a, "video 2" input from the input terminal 42b or the output from the tuner can be selected.

In FIG. 14, since each of the high-impedance circuits 10a and 10b has a high-impedance at a degree of 10 MΩ, for example, it is possible to make capacitance values of the coupling capacitors 44a and 44b small. Therefore, the coupling capacitors 44a and 44b can be incorporated in an integrated circuit. If no high-impedance circuit is utilized, a coupling capacitor having a larger capacitance value is required, and such a coupling capacitor having a larger capacitance value can not be incorporated in an integrated circuit. In addition, the direct current voltage Vref is for restoring a direct current component which has been cut-off by the coupling capacitor 44a or 44b.

Figure 15:
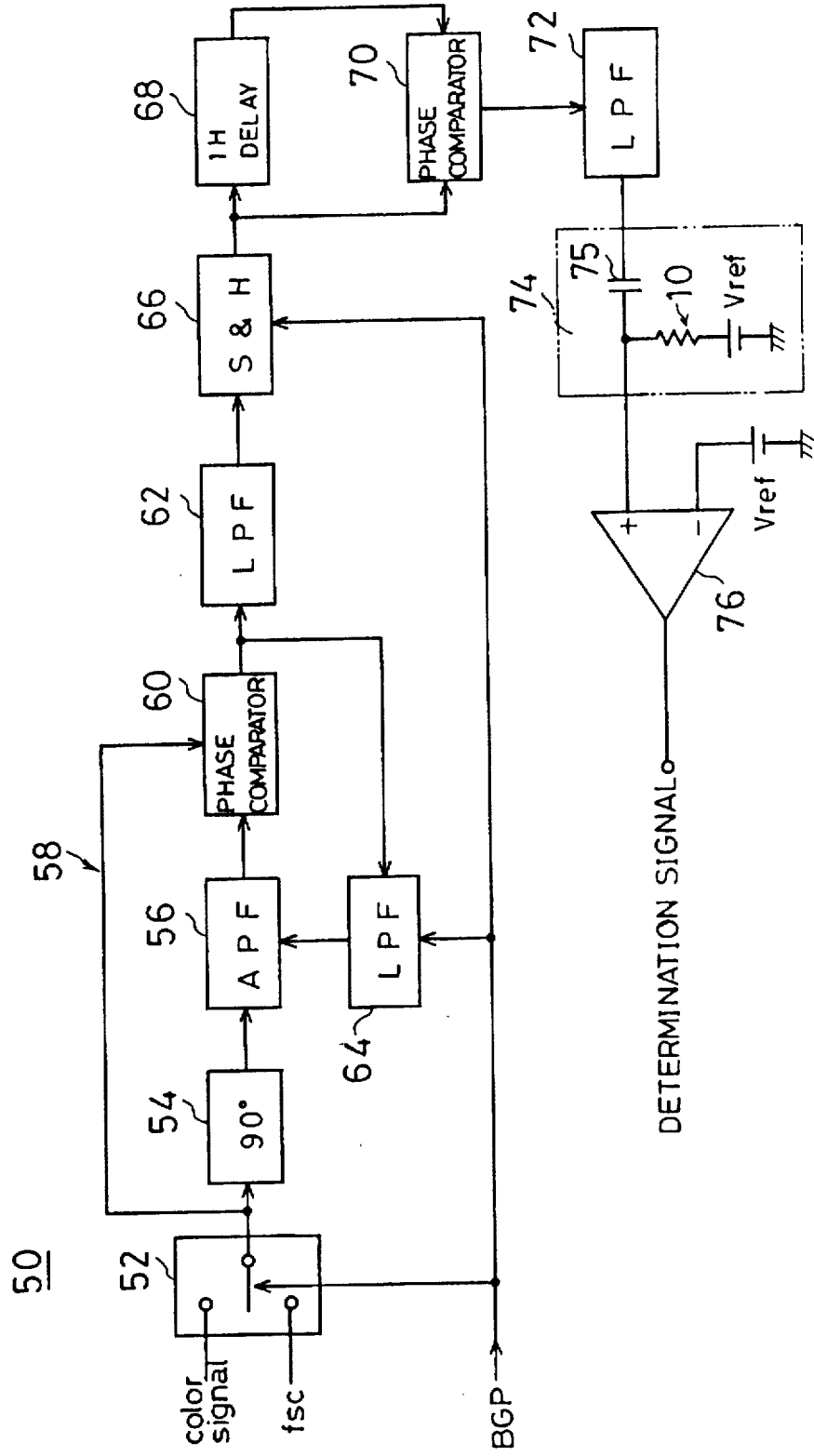
FIG. 15 shows a block diagram of a PAL/SECAM determination circuit to which the high-impedance circuit according to the present invention can be applied.

With referring to FIG. 15, a PAL/SECAM determination circuit 50 to which the high-impedance circuit 10 according to the present invention can be applied includes a multiplexer 52. A color signal and a frequency signal fsc are inputted to the multiplexer 52. The frequency signal fsc is a signal having a frequency equal to or in the vicinity of a sub-carrier frequency (4.43 MHz) of a PAL system. Then, to the multiplexer 52, a burst gate pulse (BGP) is further applied, and the color signal is outputted from the multiplexer 52 during a burst period that the burst gate pulse is applied, and the frequency signal fsc is outputted during a period other than the burst period. An output of the multiplexer 52 is applied to an all-pass filter (hereinafter, simply called as "APF") 56 having a relatively low quality factor (Q=12, for example) via a 90° phase-shifter 54.

The APF 56 performs so-called frequency-phase conversion. In this embodiment, the sub-carrier frequency of 4.43 MHz is utilized as the reference frequency, and when a color signal having the sub-carrier frequency of 4.43 MHz is applied to the APF 56, the APF 56 phase-shifts the color signal by 180 degrees. Therefore, the sub-carrier frequency of the color signal applied to the APF 14 is not 4.43 MHz, a phase-shifting amount is deviated from 180 degrees in accordance with a difference between the frequency and 4.43 MHz.

Then, the signal having a phase delayed by the 90° phase-shifter 54 and the APF 56, and the signal from the multiplexer 12 through the path 58 are applied to a phase-comparator 60. Thus, when the phase difference of the both signals inputted to the phase-comparator 60 is 90 degrees, a voltage signal of approximately zero is outputted from the LPF 62. When the phase difference of the both signals is deviated from the 90 degrees, a positive or negative voltage signal according to a deviation amount is outputted from the LPF 62. That is, in the phase-comparator 60 and the LPF 62, the input and output of the APF 56 are phase-compared, and the phase-voltage conversion is performed.

Furthermore, a control signal from the phase-comparator 60 is fed-back to the APF 56 via an LPF 64 provided for calibration. However, the LPF 64 does not output the voltage signal during the burst period and holds the same. By feeding the output from the phase-comparator 60 back to the APF 56 through the LPF 64, it is possible to make a phase delay operation of the APF 56 stable. More specifically, by applying the frequency signal of 4.43 MHz to the APF 56 during a period other than the burst period, the center frequency of the APF 56 is automatically adjusted to be coincident with 4.43 MHz, and therefore, when the color signal having the sub-carrier frequency of 4.43 MHz is applied to the APF 56, the phase is controlled in a manner that the phase difference of the input and the output becomes always −180 degrees, so that the center frequency adjustment can be performed.

That is, the phase-comparator 60 operates as for the television signal determination during the burst period, and as for the automatic adjustment of the center frequency of the APF 56 during a period other than the burst period.

Then, the voltage signal from the LPF 62 is applied to a sampling/holding circuit 66. The sampling/holding circuit 66 samples and holds the voltage signal from the LPF 62 during the burst period for 1H period by utilizing the burst gate pulse. More specifically, the burst gate pulse is applied to the sampling/holding circuit 66, and at a time point of a trailing edge of the burst gate pulse, for example, the sampling/holding circuit 66 samples and holds the voltage signal applied from the LPF 62 so as to produce a rectangular-wave signal which is applied to a 1H delay circuit 68 and a phase-comparator 70. In the 1H delay circuit 68, the rectangular-wave signal is delayed by 1 horizontal line (1H), and thereafter, applied to the phase-comparator 70. The phase-comparator 70 is constructed as similar to the phase-comparator 60. Therefore, in the phase-comparator 70, if a phase difference of two rectangular-wave signals is 180 degrees, a signal of the high level is outputted, and if the two rectangular-wave signals are in-phase, a signal of the low level is outputted.

Two rectangular-wave signals having a phase difference of 180 degrees are inputted to the phase-comparator 70 in the SECAM system, for example, and in the PAL system and the NTSC system, two rectangular-wave signals being in-phase are inputted to the phase-comparator 70, for example. In a case of a black-white noise, two rectangular-wave signals having a random phase difference are inputted to the phase-comparator 70. Therefore, the phase-comparator 70 outputs any one of signals having different levels according to the television system or the noise. Then, the signal is converted into a voltage signal having a level according to the level of the signal by an LPF 72. The voltage signal is applied to a level-comparator 76 having a hysteresis characteristic to be compared with a reference voltage Vref via a coupling circuit 74. If the voltage signal from the LPF 72 is larger than the reference voltage Vref, a determination signal of the high level is outputted at a TTL level from the level-comparator 76, and the voltage signal is smaller than the reference voltage, a determination signal of the low level is outputted. In accordance with such a determination signal, it becomes possible to determine whether a television system being received is any one of the SECAM system, and other PAL system or NTSC system. In addition, the level-comparator 76 has the hysteresis characteristic such that the determination signal outputted therefrom does not occur the chattering even if a signal that it is difficult to determine is inputted.

Thus, in the PAL/SECAM determination circuit 50, the PAL system or the SECAM system can be determined. That is, the determination signal from the comparator 76 becomes the high level in the PAL system, or the low level in the SECAM system, and therefore, it is possible to determine the both systems. In addition, FIG. 15 embodiment can be applied to determination of the SECAM system or the NTSC system.

In FIG. 15 embodiment, the coupling circuit 74 includes a coupling capacitor 75 and the high-impedance circuit 10 according to the present invention. That is, a series circuit of the high-impedance circuit 10 and a direct current voltage Vref is connected between a connection point of the coupling capacitor 75 and the comparator 76, and the ground. At that time, since the high-impedance circuit 10 has large impedance at a degree of 10 MΩ, for example, it is possible to make a capacitance value of the coupling capacitor 75 small. In a case where no high-impedance circuit is utilized, the capacitance value of a coupling capacitor is required to be made larger, and it is necessary to connect such a coupling capacitor at an outside of an integrated circuit; however, if the high-impedance circuit 10 is utilized as done in this embodiment shown, the capacitance value of the coupling capacitor 75 can be made smaller, and therefore, it is possible to incorporate the coupling capacitor 75 in the integrated circuit.

Figure 16:
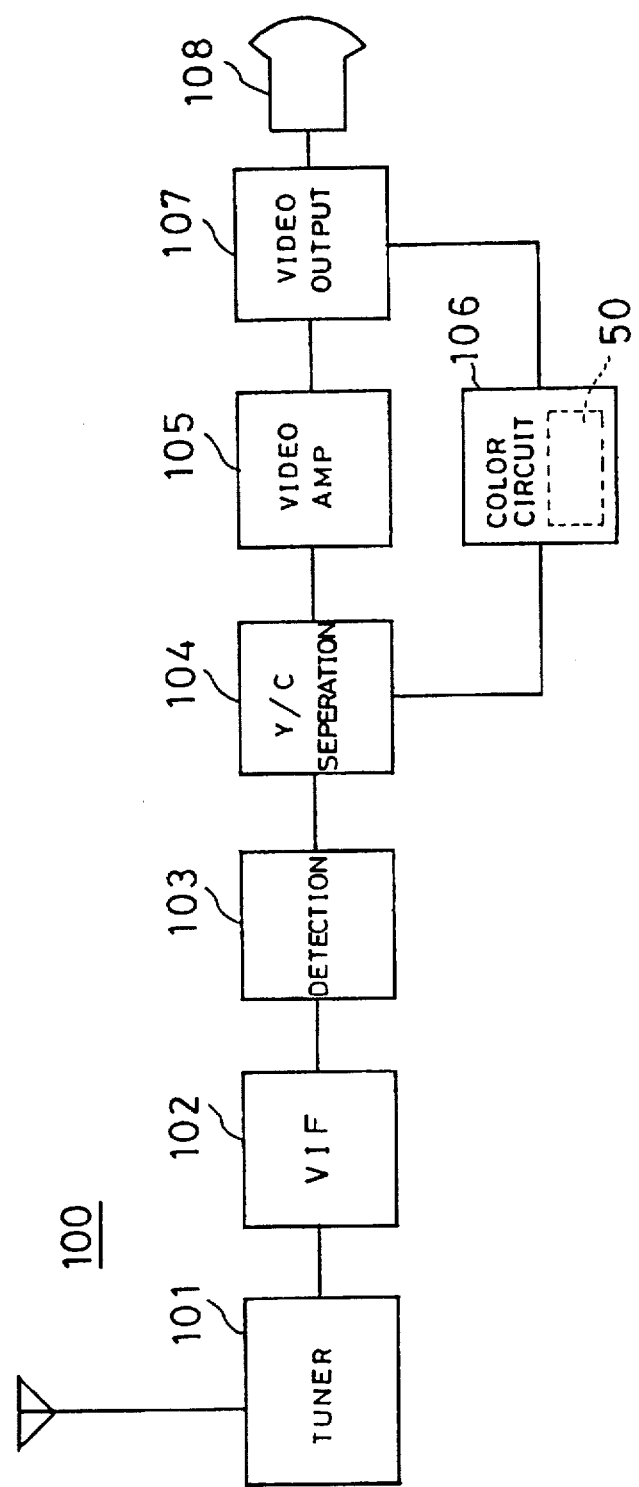
FIG. 16 shows a block diagram of a television receiver in which the PAL/SECAM determination circuit of FIG. 15 is incorporated.
Figure 17:
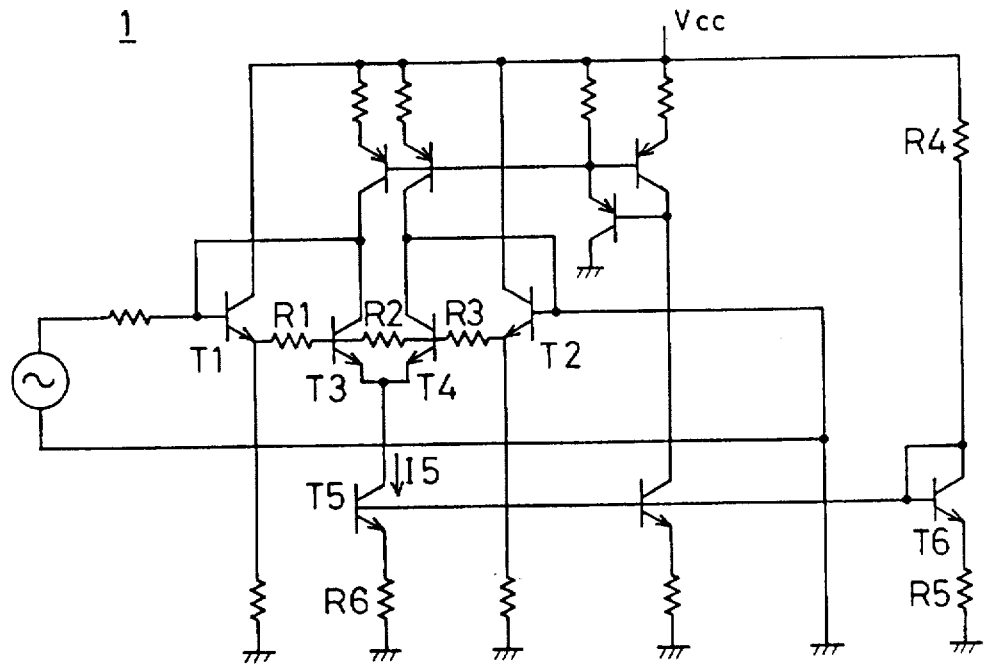
FIG. 17 shows a principle of a conventional example of a high-impedance circuit.
Figure 18:
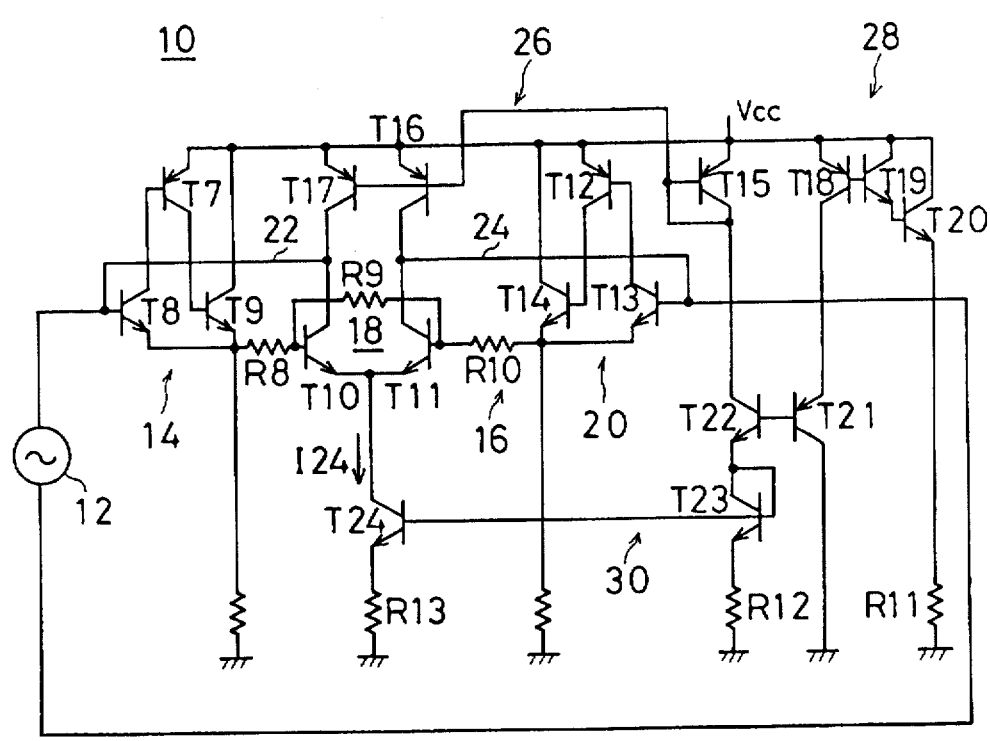
FIG. 18 is a high-impedance circuit of a conventional example.

FIG. 15 PAL/SECAM determination circuit 50 is incorporated in a a color circuit 106 which is increased in a television receiver or a television signal recording/reproducing apparatus 100 shown in FIG. 16. More specifically, the television receiver or the apparatus 100 includes a tuner 101 which receives an electromagnetic wave from antenna and outputs a video intermediate frequency signal, and the video intermediate frequency (VIF) signal from the tuner 101 is applied to a VIF circuit 102 to be amplified. The VIF signal from the VIF circuit 102 is detected by a detection circuit 103. An output from the detection circuit 103 is inputted to a Y/C separation circuit 104. The Y/C separation circuit 104 separates a luminance signal (Y signal) component and a color signal (C signal) component from a video signal detected. The luminance signal separated by the Y/C separation circuit 104 is amplified by a video amplifier 105. The color signal separated by the Y/C separation circuit 104 is inputted to the color circuit 106. The color circuit 106 includes the television signal determination circuit 10, and the SECAM system or the PAL system, for example, is changed in response to the determination output from the determination circuit 10. More specifically, in response to the determination output, the control such as the changing of the frequency of the sub-carrier oscillator, for example, may be performed. In addition, if the determination signal indicative of the PAL system is outputted, the burst phase is changed in a color demodulation circuit (not shown). Thus, in response to the determination signal from the PAL/SECAM determination circuit 50, a color demodulation operation is switched. Then, the color signal component from the color circuit 106 is applied to a video output circuit 107 together with the luminance signal component, and therefore, a television video image is displayed on a television monitor 108 by the video output circuit 107.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-impedance circuit comprising:
   a differential pair circuit including a first transistor and a second transistor; and a buffer circuit for converting an output of said differential pair circuit into a current so as to feedback a current to the differential pair circuit as an input current therefor; wherein an output of the buffer circuit supplies respective base currents of said first transistor and said second transistor;

emitters of said first transistor and said second transistor are commonly connected to the ground via a first constant current source, and said differential pair circuit further comprises current determining means connected to said first transistor and said second transistor for determining currents which flow in said first transistor and said second transistor, respectively; and said current determining means includes a first emitter resistance element inserted between the emitter of said first transistor and said first constant current source, and a second emitter resistance element inserted between the emitter of said second transistor and said first constant current source.

2. A high-impedance circuit comprising:

a differential pair circuit including a first transistor and a second transistor; and a buffer circuit for converting an output of said differential pair circuit into a current so as to feedback a current to the differential pair circuit as an input current therefor wherein;

an output of the buffer circuit supplies respective base currents of said first transistor and said second transistor;

emitters of said first transistor and said second transistor are commonly connected to the around via a first constant current source, and said differential pair circuit further comprises current determining means connected to said first transistor and said second transistor for determining currents which flow in said first transistor and said second transistor, respectively; and said current determining means includes base current determining means connected between the output of said buffer circuit and respective bases of said first transistor and said second transistor for determining respective base currents of said first transistor and said second transistor.

3. A high-impedance circuit according to claim 2, wherein said base current determining means includes a first resistance element connected between the output of said buffer circuit and the base of said first transistor, and a second resistance element connected between a connection point of the output of said buffer circuit and said first resistance element, and the base of said second transistor.

4. A high-impedance circuit comprising:

a differential pair circuit including a first transistor and a second transistor; and a buffer circuit for converting an output of said differential pair circuit into a current so as to feedback a current to the differential pair circuit as an input current therefor, wherein said buffer circuit includes a first cascade connection circuit including a first pair of transistors connected to each other in a cascade fashion and having a cascade connection point connected to the output of said differential pair circuit, and a base of one transistor of said first pair of transistors is connected to a signal terminal, and said buffer circuit further includes a second constant current source by which a constant current flows in said first cascade connection circuit, and a current according to the output of said differential pair circuit flows into or out of said first cascade connection circuit, and respective base currents of said first transistor and said second transistor are supplied in accordance with the current.

5. A high-impedance circuit according to claim 4, wherein said buffer circuit includes a further transistor which is connected to a transistor which is included in said first pair of transistors and supplies said base current in a Darlington fashion.

6. A high-impedance circuit according to claim 5, wherein said second constant current source is connected between said further transistor and a reference potential.

7. A high-impedance circuit according to claim 4, wherein said second constant current source is connected between a transistor at a side of said first pair of transistors and a reference potential.

8. A high-impedance circuit according to claim 4, wherein said buffer circuit further includes a second cascade connection circuit having a second pair of transistors connected to each other in a cascade fashion, and bases of said first pair of transistors are connected to bases of said second pair of transistors to each other, respectively, so as to form current mirror circuits, and said signal input terminal is connected to a base connection point of a transistor at an output side of said first pair of transistor and corresponding one transistor of second pair of transistors.

9. A high-impedance circuit according to claim 8, wherein said buffer circuit includes further transistors each connected to each of said first pair of transistors and said second transistors in a Darlington manner.

10. A high-impedance circuit according to claim 8, wherein said buffer circuit includes further transistors connected to a pair of transistors which constitute at least one of said first cascade connection circuit and said second cascade connection circuit, respectively.

11. A high-impedance circuit according to claim 10, wherein said buffer circuit includes a first transistor having an emitter connected to an output; a second transistor having an emitter connected to a collector of said first transistor; a second transistor having an emitter connected to one of a power source and a reference potential and a base connected to a base of said second transistor; a fourth transistor having an emitter connected to a collector of said third transistor and a base connected to the emitter of said second transistor; a fifth transistor having a base connected to a base of said first transistor and an emitter connected to a collector of said fourth transistor; and a sixth transistor having an emitter connected to a collector of said fifth transistor and a base connected to said output and a collector connected to other of said power source and said reference potential.

12. A high-impedance circuit according to claim 4, wherein said buffer circuit includes two transistors having bases commonly connected to a base of one transistor of said first pair of transistors.

13. A high-impedance circuit according to claim 12, wherein an output of said one transistor of said two transistors is connected to said signal input terminal.

14. A high-impedance circuit according to claim 12, wherein said buffer circuit includes a further transistor connected to said one transistor of said two transistors in a cascade fashion.

15. A high-impedance circuit according to claim 14, wherein a base of said further transistor is connected to the cascade connection point of said first pair of transistors, and an output of said further transistor is connected to said signal input terminal.

16. A high-impedance circuit according to claim 14, wherein a base of said further transistor is connected to a base of one transistor of said first pair of transistors, and an output of said further transistor is connected to said signal input terminal.

17. A high-impedance circuit, comprising:
a differential pair circuit including a first transistor and a second transistor;
base current compensating means including an input transistor to which a signal is inputted, and a cascade connection circuit and a current mirror connection circuit which compensate a base current of the input transistor; and
an impedance dividing circuit connected between the differential pair circuit and the base current compensating means for dividing input impedance of the transistors of the differential pair circuit.

18. A high-impedance circuit, comprising:
a differential pair circuit including a first transistor and a second transistor;
base current compensating means including an input transistor to which a signal is inputted, and a cascade connection circuit and a Darlington connection circuit which compensate a base current of the input transistor; and
an impedance dividing circuit connected between the differential pair circuit and the base current compensating means for dividing input impedance of the transistors of the differential pair circuit.

19. A high-impedance circuit, comprising:
a differential pair circuit including a first transistor and a second transistor;
current limiting means connected to the differential pair circuit for making currents of respective transistors of the differential pair circuit equal to each other;
an input circuit including an input transistors to which a signal is inputted, and connected to one end of an output of the differential pair circuit and for compensating a base current of the input transistor and for feeding a difference between inputs of the differential pair circuit back to the differential pair circuit so as to balance the inputs of the differential pair circuit with each other; wherein
emitters of said first transistor and said second transistor are commonly connected to the around via a first constant current source, and said differential pair circuit further comprises current determining means connected to said first transistor and said second transistor for determining currents which flow in said first transistor and said second transistor, respectively; and
a first emitter resistance element is inserted between the emitter of said first transistor and said first constant current source, and a second emitter resistance element is inserted between the emitter of said second transistor and said first constant current source.

20. A television signal processing apparatus, comprising:
a coupling capacitor for transferring a signal; and
a high-impedance circuit connected to said coupling capacitor, said high-impedance circuit including a differential pair circuit which includes a first transistor and a second transistor, and
a buffer circuit which includes a third transistor, and converts an output of one of the transistors of said differential pair circuit into a base current of said third transistor, and connects an output of said third transistor to another of the transistors of said differential pair circuit so as to feedback the output of said one of the transistors to said another of the transistors of said differential pair circuit, said buffer circuit including a first cascade connection circuit including a first pair of transistors connected to each other in a cascade fashion and having a cascade connection point connected to the output of said differential pair of circuit, and a base of one transistor of said first pair of transistors is connected to a signal terminal, said buffer circuit further including a constant current source by which a constant current flows in said first cascade connection circuit, and a current according to the output of said differential pair circuit flows into or out of said first cascade connection circuit, and respective base currents of said first transistor and said second transistor are supplied in accordance with the current.

21. A television signal processing apparatus according to claim 20, wherein one end of said coupling capacitor is connected to a signal input, and said high-impedance circuit is connected between other end of said coupling capacitor and a reference potential.

22. A high-impedance circuit, comprising:
a differential pair circuit including a first transistor and a second transistor; and
a buffer circuit including an input transistor having an input end connected to its base, wherein an output of one of said first transistor, and said second transistor of said differential pair circuit is inputted to said base of said input transistor after being converted by a factor of 1/(the current amplification factor of said input transistor)$^n$ where n is a positive integer, and an output of said input transistor is fed-back to the other of said first transistor and said second transistor of said differential pair circuit.

* * * * *